US008164380B2

(12) United States Patent
Hosokawa et al.

(10) Patent No.: US 8,164,380 B2
(45) Date of Patent: Apr. 24, 2012

(54) DISCRETE FILTER, SAMPLING MIXER AND WIRELESS DEVICE

(75) Inventors: Yoshifumi Hosokawa, Osaka (JP); Noriaki Saito, Tokyo (JP); Kentaro Miyano, Osaka (JP); Katsuaki Abe, Cupertino, CA (US)

(73) Assignee: Panasonic Corporation, Osaka (JP)

( * ) Notice: Subject to any disclaimer, the term of this patent is extended or adjusted under 35 U.S.C. 154(b) by 15 days.

(21) Appl. No.: 12/667,370

(22) PCT Filed: Jul. 3, 2008

(86) PCT No.: PCT/JP2008/001768
§ 371 (c)(1),
(2), (4) Date: Dec. 30, 2009

(87) PCT Pub. No.: WO2009/004818
PCT Pub. Date: Jan. 8, 2009

(65) Prior Publication Data
US 2010/0182077 A1    Jul. 22, 2010

(30) Foreign Application Priority Data

Jul. 5, 2007    (JP) ................................. 2007-176920
Nov. 22, 2007   (JP) ................................. 2007-302678
Jun. 26, 2008   (JP) ................................. 2008-167269

(51) Int. Cl.
*H03K 5/00* (2006.01)
(52) U.S. Cl. ......... 327/554; 327/552; 327/355; 455/323
(58) Field of Classification Search .......... 327/355–361, 327/551–559, 136–137; 455/323, 326
See application file for complete search history.

(56) References Cited

U.S. PATENT DOCUMENTS

| 7,623,838 | B2* | 11/2009 | Staszewski et al. ........... 455/319 |
| 7,634,247 | B2* | 12/2009 | Joet et al. ....................... 455/323 |
| 7,671,658 | B2* | 3/2010 | Harada et al. ................. 327/355 |
| 7,679,543 | B2* | 3/2010 | Park et al. ..................... 341/172 |
| 7,791,407 | B2* | 9/2010 | Muhammad et al. ......... 327/552 |
| 7,973,586 | B2* | 7/2011 | Hosokawa et al. ........... 327/355 |
| 2003/0035499 | A1 | 2/2003 | Staszewski |
| 2003/0050027 | A1 | 3/2003 | Muhammad |
| 2003/0083033 | A1 | 5/2003 | Staszewski |
| 2009/0270061 | A1* | 10/2009 | Hosokawa et al. ........... 455/323 |

FOREIGN PATENT DOCUMENTS

| JP | 2004-289793 | 10/2004 |
| WO | 2007/061000 | 5/2007 |

OTHER PUBLICATIONS

International Search Report dated Aug. 12, 2008.
Chinese Office Action dated Aug. 17, 2011.

* cited by examiner

*Primary Examiner* — Dinh T. Le
(74) *Attorney, Agent, or Firm* — Dickinson Wright PLLC

(57) ABSTRACT

A sampling filter of such circuitry as not requiring a high frequency REF signal even if the number of decimation is decreased. In the sampling filter, the rotate capacitor in each switched capacitor circuit including Cr (7a-7d) arranged in four parallel arrays operates in four phases of integration, discharge, reset and feedback different from each other at the same timing. Consequently, a control signal for driving the switched capacitor circuit is used commonly. As a result, the circuit scale of a DCU (104) is reduced and the frequency of the REF signal can be lowered to the frequency of an LO signal even in operation without decimation.

11 Claims, 26 Drawing Sheets

1400-1 NON-OVERLAP CIRCUIT

DISCRETE FILTER, SAMPLING MIXER AND WIRELESS DEVICE

TECHNICAL FIELD

The present invention relates to a discrete filter, sampling mixer, and radio apparatus that perform digital signal processing such as filtering.

BACKGROUND ART

In a sampling mixer, a digitally modulated signal is sampled by a sampling circuit, and a filter effect is obtained by a switched capacitor incorporated in the sampling circuit (see Patent Document 1 and Patent Document 2, for example).

FIG. 1 is a circuit diagram of sampling mixer 600 described in Patent Document 1, and FIG. 2 is a drawing showing a timing chart of control signals in sampling mixer 600.

In FIG. 1, sampling mixer 600 is provided with TA (transconductance amplifier) 1 that converts a received radio frequency (RF) signal to RF current $i_{RF}$, in-phase mixer section 2 that samples RF current $i_{RF}$ converted by TA 1, reverse-phase mixer section 3 that is combined therewith, and DCU 4 that generates control signals to in-phase mixer section 2 and reverse-phase mixer section 3.

In-phase mixer section 2 includes sampling switch 5, and Ch (history capacitor) 6 that performs temporally continuous integration of signals sampled by sampling switch 5. In-phase mixer section 2 also includes Cr (rotation capacitors) 7 through 14 that repeat integration and discharge of signals sampled by sampling switch 5, and Cb (buffer capacitor) 15 that buffers signals discharged by Cr 7 through 14.

Furthermore, in-phase mixer section 2 includes damping switch 16 for discharging signals held by Cr 7 through 14 to Cb 15, reset switch 17 that resets signals held by Cr 7 through 14 after signal discharging, and integration switches 18 through 25 for sequentially connecting Cr 7 through 14 to Ch 6. In addition, in-phase mixer section 2 includes discharge switches 26 through 33 for sequentially connecting Cr 7 through 14 to Cb 15, and feedback switches 34 and 35 that control feedback signal input to the sampling mixer 600 side from a DA (digital/analog) converter.

The operation of sampling mixer 600 will now be described, taking the operation of in-phase mixer section 2 as an example.

First, RF current $i_{RF}$ is sampled by sampling switch 5, and becomes temporally discretized discrete signals. These discrete signals are sequentially integrated by Ch 6 and Cr 7 through 14 based on the SV0 through SV7 signals, and undergo filtering and decimation.

By this means, an 8-tap FIR (Finite Impulse Response) filter effect is obtained. The sampling rate at this time is decimated to 1/8. This is because signals held by eight integration switches 18 through 25 are subjected to moving averaging. Such a filter is called a first stage FIR filter. The transfer function of a first stage FIR filter is shown by the following equation.

(Equation 1)

$$H_{FIR1} = \frac{1-z^{-8}}{1-z^{-1}} \quad [1]$$

Furthermore, since Ch 6 sequentially connected to Cr 7 through 14 holds an output potential, an IIR (Infinite Impulse Response) filter effect is also obtained. Such a filter is called a first stage IIR filter. The transfer function of a first stage IIR filter is shown by the following equation, where Ch is the capacitance value of Ch 6 and Cr is the capacitance value of Cr 7 through 14.

(Equation 2)

$$H_{IIR1} = \frac{1}{Ch + Cr - Chz^{-1}} \quad [2]$$

Moreover, when an SAZ signal is input to the gates of discharge switches 30 through 33, discharge switches 30 through 33 are turned on while the SAZ signal is high. Then discrete signals integrated by Cr 11 through 14 are simultaneously discharged to Cb 15 via on-state discharge switches 30 through 33.

After this discharging, the D signal goes low, damping switch 16 is turned off, and Cb 15 is disconnected from Cr 11 through 14.

Then the R signal goes high, reset switch 17 is turned on, and signals held by Cr 11 through 14 are reset.

In this way, signals integrated by Cr 11 through 14 are discharged to Cb 15 simultaneously, and a 4-tap FIR filter effect is thereby obtained. The sampling rate at this time is decimated to 1/4. This is because signals integrated by Cr 11 through 14 are subjected to moving averaging by Cb 15.

Signals integrated by Cr 7 through 10 also function in a similar way to Cr 11 through 14. Such a filter is called a second stage FIR filter. The transfer function of a second stage FIR filter is shown by the following equation.

(Equation 3)

$$H_{FIR2} = \frac{1}{4}\frac{1-z^{-4}}{1-z^{-1}} \quad [3]$$

Four Cr's are connected to Cb 15 in a four Cr 7 through 10 or four Cr 11 through 14 group unit. By this means, an IIR filter effect is also obtained. Such a filter is called a second stage IIR filter. The transfer function of a second stage IIR filter is shown by the following equation, where Cb is the capacitance value of Cb 15.

(Equation 4)

$$H_{IIR2} = \frac{4Cr}{4Cr + Cb - Cbz^{-1}} \quad [4]$$

Reverse-phase mixer section 3 operates in almost the same way as in-phase mixer section 2, except that sampling is performed 1/2 period later than in the case of in-phase mixer section 2.

When sampling mixer 600 is configured in this way, an output signal of that sampling mixer 600 is a signal that has passed through a first stage FIR filter, first stage IIR filter, second stage FIR filter, and second stage IIR filter, and the overall filter transfer function is given by Equation (1), Equation (2), Equation (3), Equation (4), and the following equation using an equation for current conversion by TA 1, where gm is the transconductance of TA 1 and $f_{RF}$ is the frequency of an input RF signal.

(Equation 5)

$$H = \frac{gm}{\pi f_{RF}} H_{FIR1} H_{IIR1} H_{FIR2} H_{IIR2} \quad [5]$$

$$= \frac{gm}{\pi f_{RF}} \frac{1-z^{-8}}{1-z^{-1}} \frac{1}{(C_H + C_R) - C_H z^{-8}} \frac{1}{4} \frac{1-z^{-32}}{1-z^{-8}}$$

$$\frac{4C_R}{(4C_R + C_B) - C_B z^{-32}}$$

Filter characteristics of the above-described types of filter will now be described with reference to FIG. 3. It will be assumed here that the LO signal frequency is 2.4 GHz, Ch 6 is 15 pF, Cr 7 through 14 are 0.5 pF, Cb 15 is 15 pF, and the transconductance of TA 1 is 7.5 mS.

FIG. 3(a) shows a first stage FIR filter characteristic, FIG. 3(b) shows a first stage IIR filter characteristic, FIG. 3(c) shows a second stage FIR filter characteristic, FIG. 3(d) shows a second stage IIR filter characteristic, and FIG. 3(e) shows an overall filter characteristic of sampling mixer 600. In the conventional-technology characteristic examples in FIG. 3, a signal sampled at 2.4 GHz by sampling switch 5 is output after undergoing 32-decimation. The sampling frequency at this time is 300 MHz, and frequency components separated from the LO frequency in 300 MHz units are folded back to the vicinity of a desired wave. There is a thus problem of a folding frequency appearing in the vicinity of a desired wave if the number of decimations is large.

In particular, when decimation operation is performed in a radio system for UHF band terrestrial digital broadcasting (approximately 470 MHz to 770 MHz) in which the reception band extends over a wide band or the like, folding frequencies appear in the reception band, and there is consequently a demand for a sampling mixer that reduces the number of decimations. Specifically, when terrestrial digital broadcast channel 13 (with a center frequency of approximately 473 MHz) is received by a sampling mixer performing 2-decimation operation, a folding frequency appears every 236.5 MHz from 473 MHz. At this time, 709.5 MHz is within a signal band of terrestrial digital broadcast channel 52 (with a center frequency of approximately 707 MHz), and a channel 52 signal is folded back, causing degradation of reception sensitivity. Therefore, it is necessary for a folding frequency at the time of channel 13 reception by a non-decimation sampling mixer to be made 946 MHz, higher than 770 MHz.

A circuit diagram of conventional sampling mixer 610 operating without decimation is shown here in FIG. 4. In FIG. 4, points of difference from sampling mixer 600 in FIG. 1 are that in-phase mixer section 42 and reverse-phase mixer section 43 are each provided with two Cr's, and DCU 44 output signals are SV0 and SV1 signals, a D signal, an R signal, and FB0 and FB1 signals. FIG. 5 shows a block diagram of DCU 44. DCU 44 is configured using a D flip-flop circuit, which is a general circuit, based on a REF signal necessary for the DCU to generate a control signal. FIG. 6 is a timing chart of sampling mixer 610 control signals. According to FIG. 5 and FIG. 6, the SV0 and SV1 signals are signals obtained by dividing the REF signal by 8, the D signal is a signal obtained by dividing the REF signal by 4, the R signal is one of 4 phased signals based on the REF signal, and the FB0 and FB1 signals are two of 8 phased signals based on the REF signal. When configuring a sampling mixer with a low number of decimations by conventional means as described above, as shown in FIG. 6 a high-frequency REF signal is necessary and control signals with different waveforms (for example, different pulse widths) must be provided.

Patent Document 1: Japanese Patent Application Laid-Open No. 2004-289793 (pp. 6-9, FIG. 3a, FIG. 3b, FIG. 4)

Patent Document 2: US Patent Application Laid-Open No. 2003/0083033 Specification, "SAMPLING MIXER WITH ASYNCHRONOUS CLOCK AND SIGNAL DOMAINS"

DISCLOSURE OF INVENTION

Problems to be Solved by the Invention

However, when the frequency of the REF signal increases, a problem with a real circuit is that the pulse shape of a control signal is distorted by a circuit load or the like, and the waveform becomes more distorted as the frequency increases. Thus, a need has arisen for the provision of a discrete filter and sampling filter having a circuit configuration that does not require a high-frequency REF signal.

Furthermore, since many control signals with different waveforms are used, the circuit scale of a control signal generation section (DCU) is large.

The present invention has been implemented taking into account the problems described above, and provides a sampling mixer that enables the number of decimations to be kept small without using a high-frequency REF signal, and enables degradation of reception sensitivity due to a foldback component to be suppressed.

Means for Solving the Problem

A discrete filter according to a first aspect of the present invention has a control signal generation section that generates N control signals (where N is an integer greater than or equal to 2) having the same frequency and different phases, and a switched capacitor section to which a received signal is input; wherein the switched capacitor section includes N switched capacitor circuits connected in parallel to each other, and each switched capacitor circuit has an integration switch that switches a state of input to a capacitor and a discharge switch that switches a state of discharge from a capacitor, and performs N operations including signal integration operations and signal discharge operations; and the N switched capacitor circuits perform mutually different operations at the same timing based on the N control signals.

A discrete filter according to a second aspect of the present invention is a discrete filter that, in a discrete filter according to the first aspect, includes a reset operation that resets a charge of the capacitor and a feedback operation in operation states of the switched capacitor circuit, and has N=4.

A discrete filter according to a third aspect of the present invention is a discrete filter that, in a discrete filter according to the first aspect, includes a feedback operation in operation states of the switched capacitor circuit, and makes a feedback signal a voltage.

A discrete filter according to a fourth aspect of the present invention is a discrete filter whereby, in a discrete filter according to the first aspect, frequencies of the N control signals are switched.

A sampling mixer according to a fifth aspect of the present invention is a sampling mixer that has a discrete filter according to the first aspect and a sampling switch that is provided before the discrete filter and samples a received signal at a predetermined frequency.

A radio apparatus according to a sixth aspect of the present invention is a radio apparatus that has a discrete filter according to the first aspect and a signal processing section that performs signal processing based on an output signal of the discrete filter.

A radio apparatus according to a seventh aspect of the present invention is a radio apparatus that has a sampling mixer according to the fifth aspect and a signal processing section that performs signal processing based on an output signal of the sampling mixer.

A discrete filter according to an eighth aspect of the present invention is a discrete filter that, in a discrete filter according to the first aspect, further has a non-overlap circuit that provides a non-overlap interval between the N control signals.

A discrete filter according to a ninth aspect of the present invention is a discrete filter whereby, in a discrete filter according to the eighth aspect, the non-overlap circuit has an AND gate to which a signal resulting from a first control signal output from the control signal generation section passing through an odd number of NOT gates and a second control signal output from the control signal generation section are input, and makes output of the AND gate a signal that is input to the switched capacitor section.

A sampling mixer according to a tenth aspect of the present invention is a sampling mixer that has a discrete filter according to the eighth aspect and a sampling switch that is provided before the discrete filter and samples a received signal at a predetermined frequency; wherein the non-overlap circuit makes the non-overlap interval a period of the sampling switch×(1−N/M) (where M and N are different natural numbers).

A radio apparatus according to an eleventh aspect of the present invention is a radio apparatus that has a sampling mixer according to the tenth aspect and a signal processing section that performs signal processing based on an output signal of the sampling mixer.

ADVANTAGEOUS EFFECTS OF INVENTION

According to the present invention, using a parallel configuration corresponding to a number of switched capacitor circuit operation states enables control signals to be shared among a plurality of switched capacitor circuits and makes control signals with a short on-time unnecessary. In addition, the circuit scale of a control signal generation section that generates control signals can be made smaller.

By this means, the number of decimations can be decreased without using a high-frequency REF signal, and degradation of reception sensitivity due to a fold-back component can be suppressed.

BEST MODE FOR CARRYING OUT THE INVENTION

Figure 1:
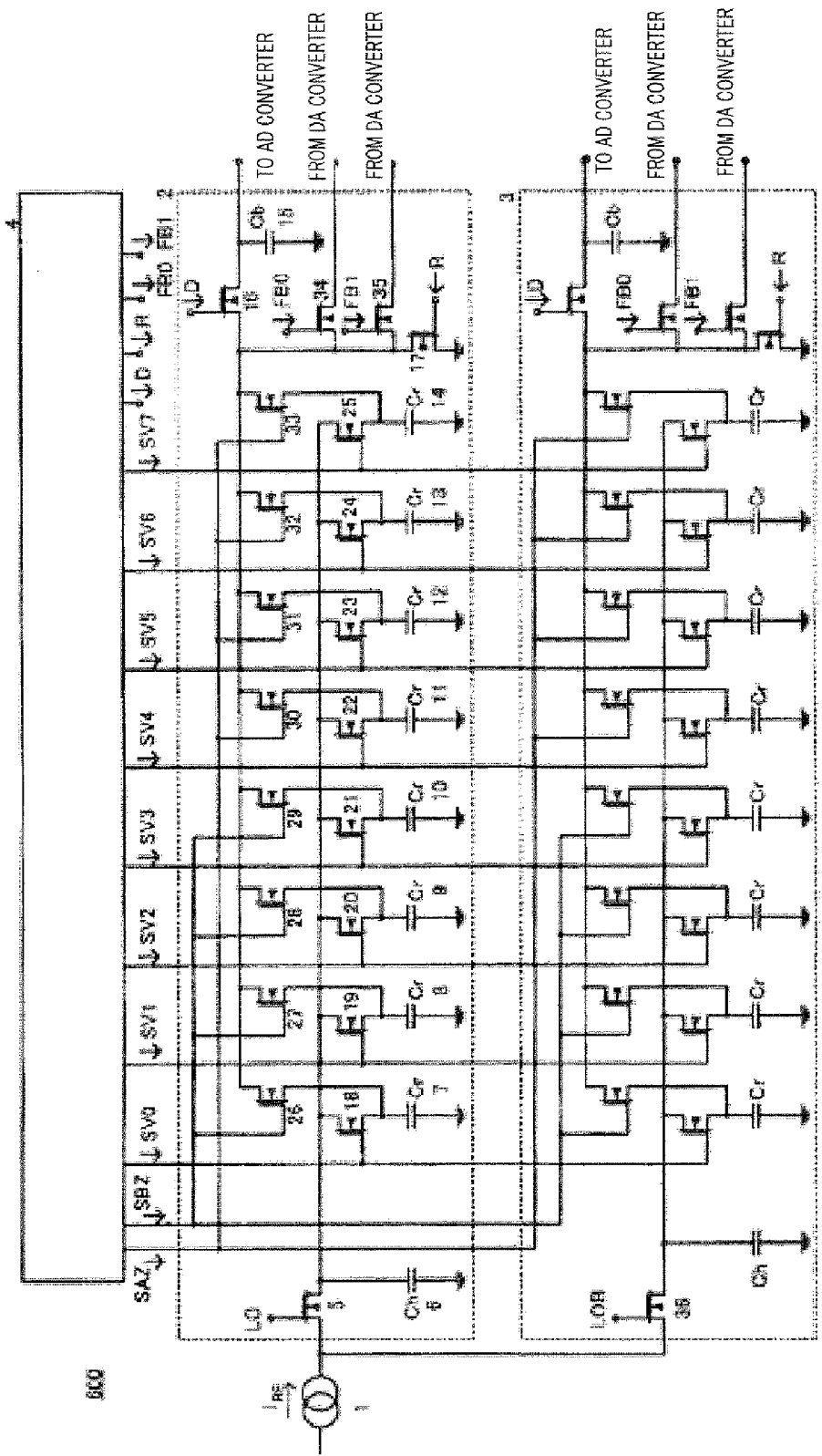
FIG. 1 is a circuit diagram of a sampling mixer according to conventional technology.
Figure 2:
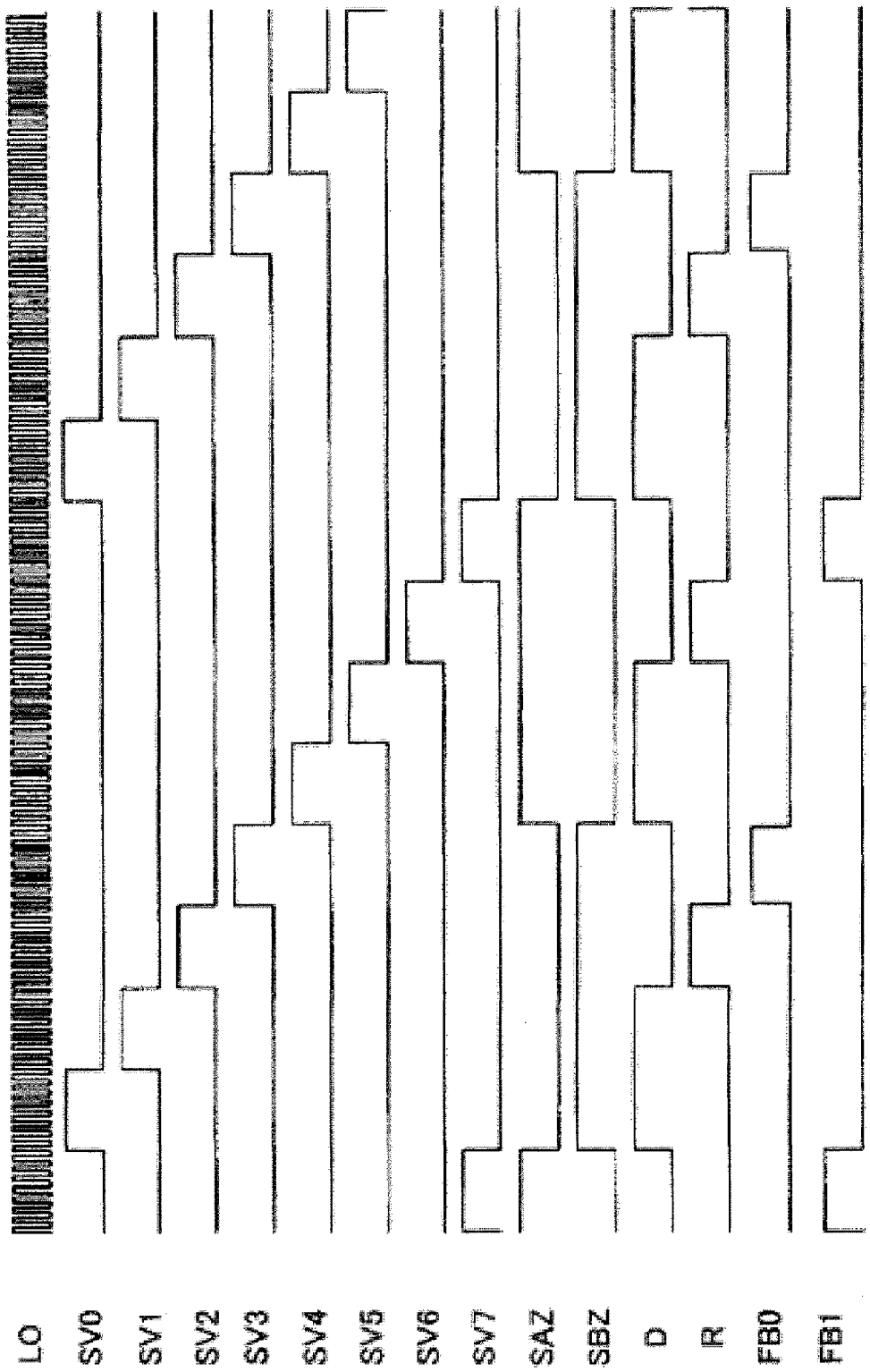
FIG. 2 is a control signal timing chart of a sampling mixer according to conventional technology.
Figure 3A:
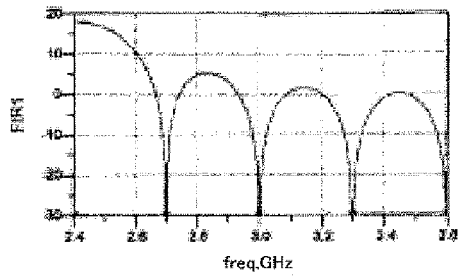
FIG. 3 shows characteristic graphs of a sampling mixer according to conventional technology.
Figure 3B:
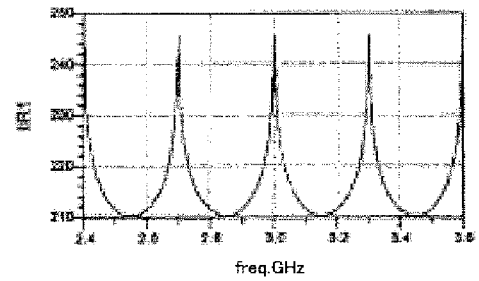
Figure 3C:
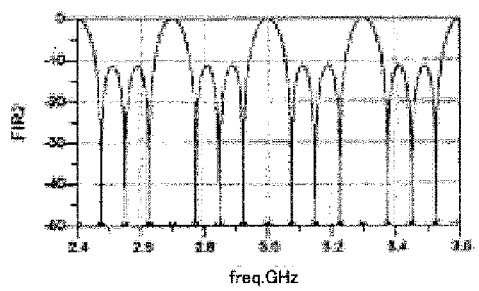
Figure 3D:
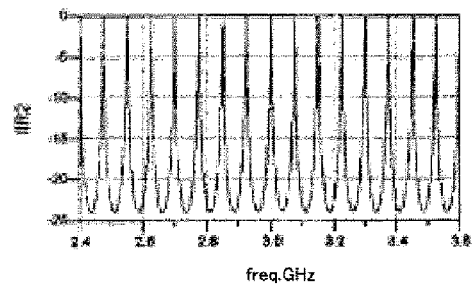
Figure 3E:
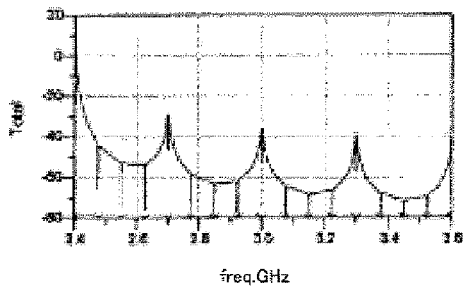
Figure 4:
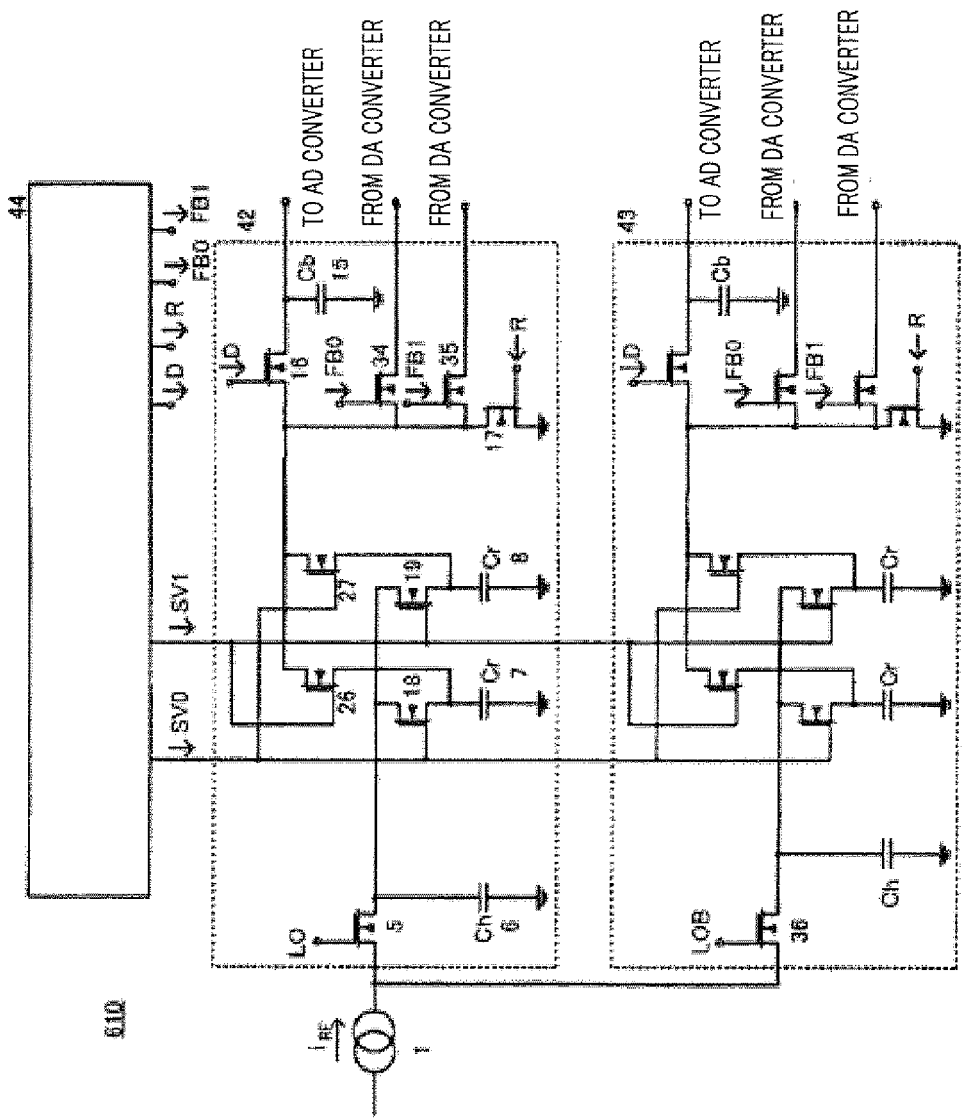
FIG. 4 is a circuit diagram of a sampling mixer according to conventional technology.
Figure 5:
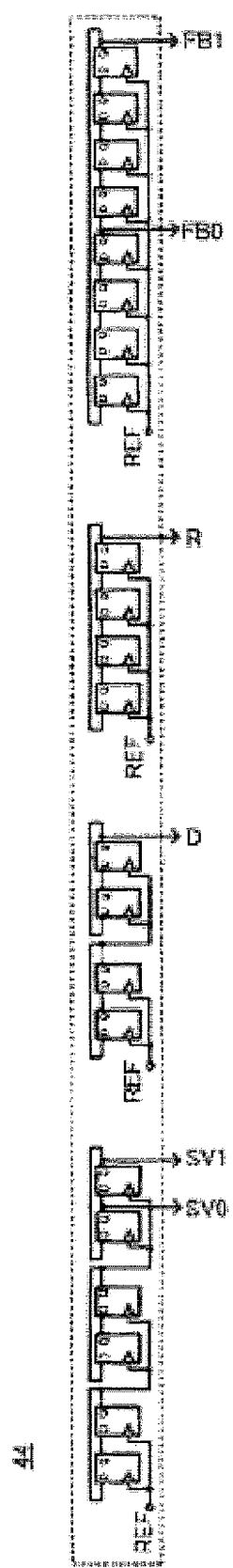
FIG. 5 is a block diagram of a digital control unit according to conventional technology.
Figure 6:
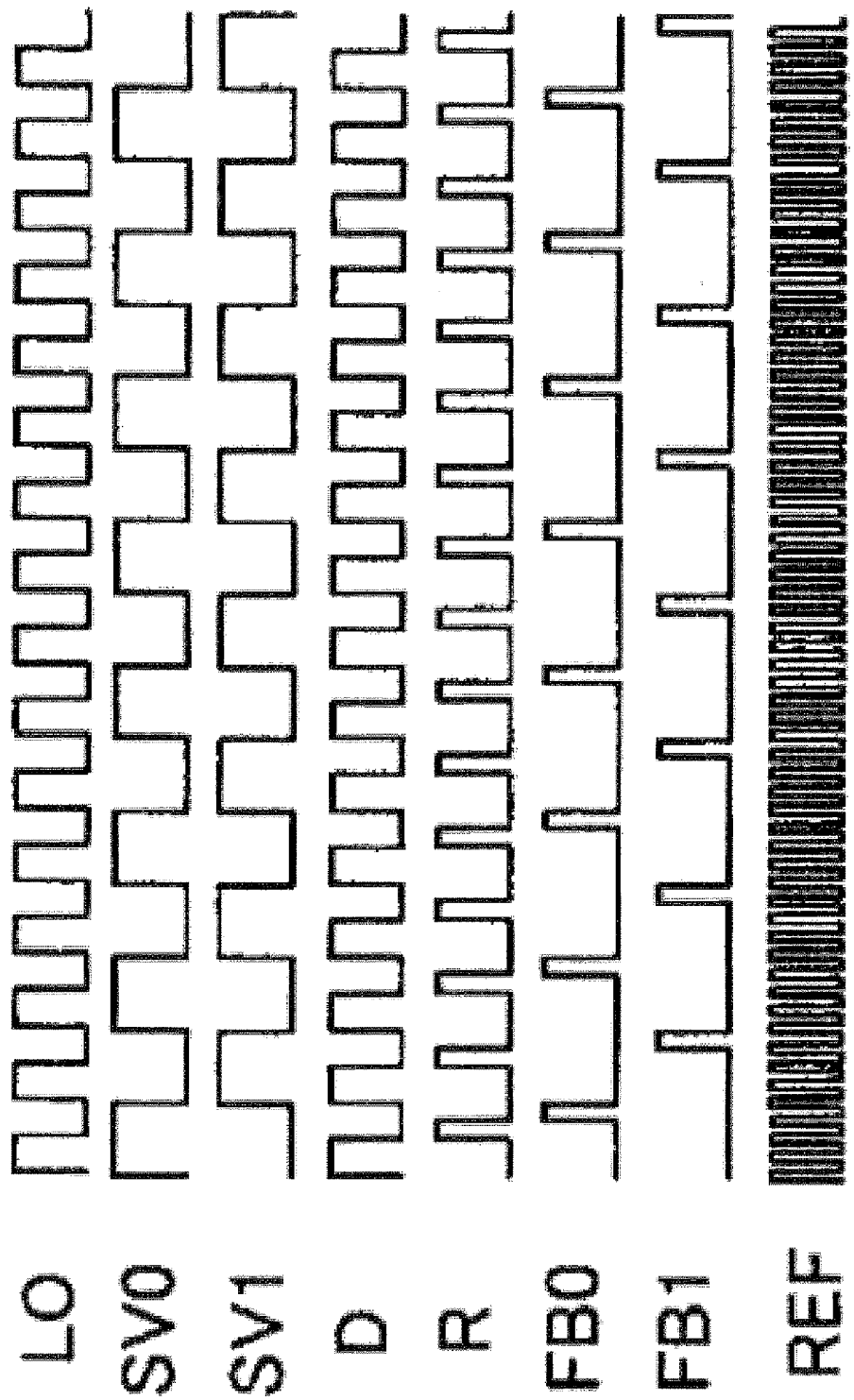
FIG. 6 is a control signal timing chart of a sampling mixer according to conventional technology.

Now, embodiments of the present invention will be described in detail with reference to the accompanying drawings. In the drawings, identical parts are assigned the same reference codes.

(Embodiment 1)

Figure 7:
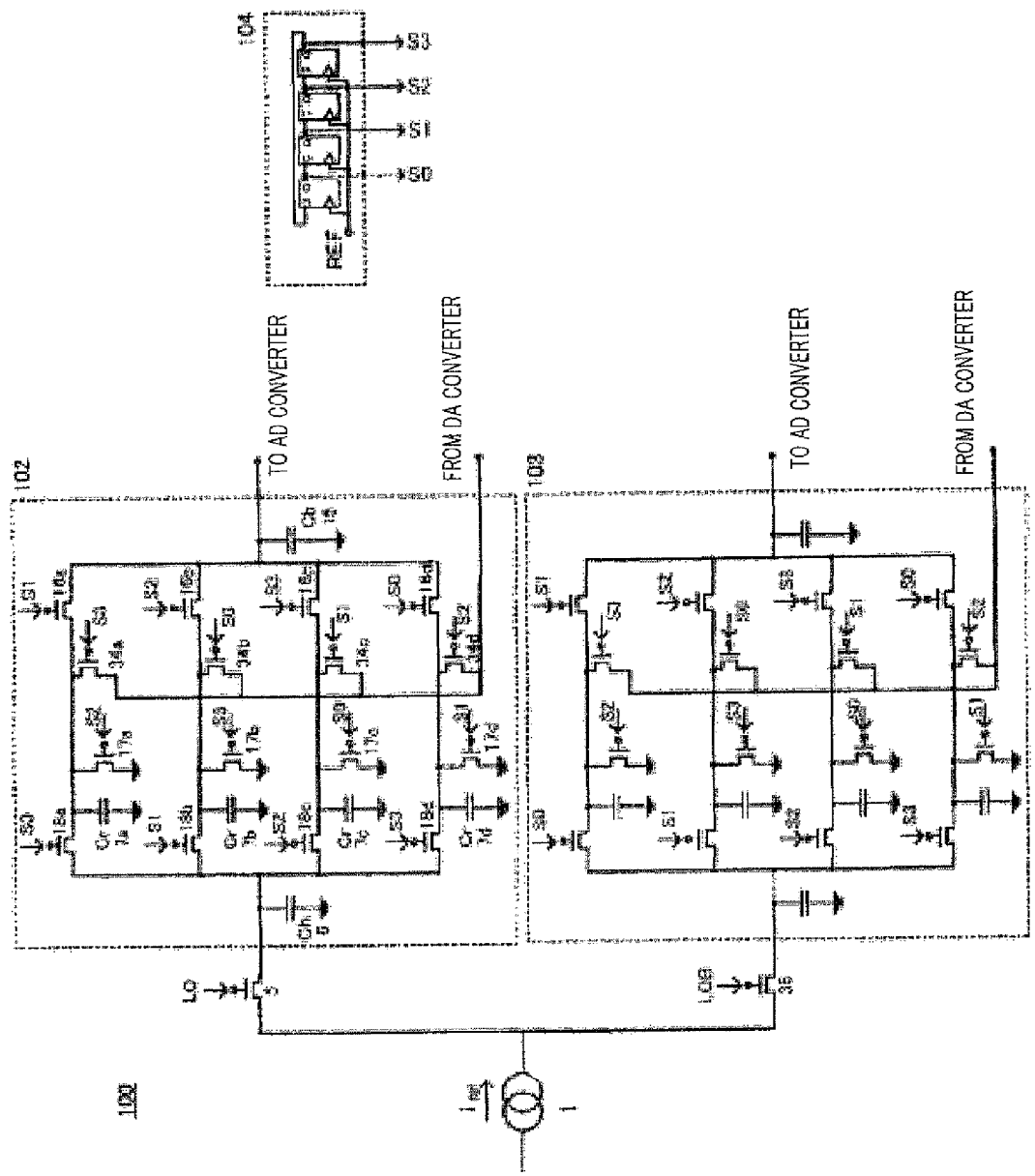
FIG. 7 is a circuit diagram of a sampling mixer according to Embodiment 1 of the present invention.

FIG. 7 is a circuit diagram of a sampling mixer according to Embodiment 1 of the present invention. In FIG. 7, sampling mixer 100 is provided with TA (transconductance amplifier) 1, switched capacitor sections 102 and 103, DCU (digital control unit, also referred to as "control signal generation section") 104, and sampling switches 5 and 36.

Switched capacitor section 102 is provided with Ch (history capacitor) 6, Cr (rotation capacitors) 7a, 7b, 7c, and 7d, damping switches 16a, 16b, 16c, and 16d, reset switches 17a, 17b, 17c, and 17d, integration switches 18a, 18b, 18c, and 18d, and feedback switches 34a, 34b, 34c, and 34d. Switched capacitor section 103 also has a similar configuration, but the phases of signals input to switched capacitor section 102 and switched capacitor section 103 differ by 180 degrees. This is because the phases of an LO signal input to the gate of sampling switch 5 connected to switched capacitor section 102 and an LO signal input to the gate of sampling switch 36 connected to switched capacitor section 103 differ by 180 degrees.

DCU 104 has a shift register configuration using a D flip-flop circuit, and outputs signals of four phases (an S0 signal, S1 signal, S2 signal, and S3 signal) based on a REF signal to switched capacitor sections 102 and 103. In this embodiment, a shift register configuration using a D flip-flop circuit is used for the DCU 104 circuit configuration, but a different circuit configuration may also be used as long as it outputs signals of four phases.

Figure 8:
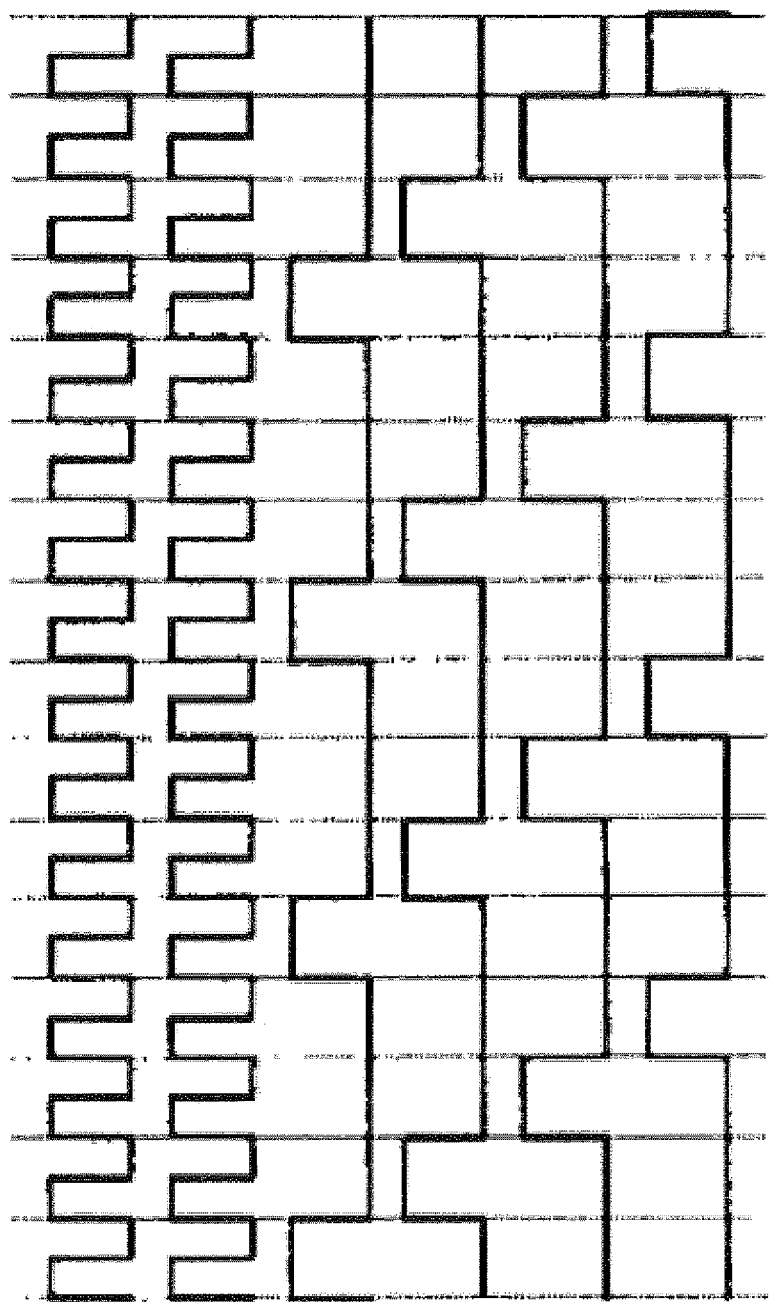
FIG. 8 is a timing chart of control signals according to Embodiment 1 of the present invention.

FIG. 8 is a timing chart of control signals used in sampling mixer 100 according to Embodiment 1 of the present invention. The S0 signal, S1 signal, S2 signal, and S3 signal are shifted by 1/4 period, and the time during which they are high is one LO signal period. Signals S0 through S3 can be generated by inputting a REF signal of the same frequency as the LO signal to the DCU 104 shift register. The S0 signal is input to the gates of integration switch 18a, feedback switch 34b, reset switch 17c, and damping switch 16d. The S1 signal is input to damping switch 16a, integration switch 18b, feedback switch 34c, and reset switch 17d. The S2 signal is input to reset switch 17a, damping switch 16b, integration switch 18c, and feedback switch 34d. The S3 signal is input to feedback switch 34a, reset switch 17b, damping switch 16c, and integration switch 18d.

The operation of sampling mixer 100 will now be described, focusing on switched capacitor section 102. First, as an initial state, when the S0 signal is high Ch 6 and Cr 7a are connected, and a discrete signal output from sampling switch 5 is integrated in Ch 6 and Cr 7a. Then, as a second state, when the S0 signal goes low and the S1 signal goes high Cr 7a and Cb 15 are connected, and the signal integrated in Cr 7a is discharged to Cb 15. As a third state, when the S1 signal goes low and the S2 signal goes high a charge remaining in Cr 7a is grounded via reset switch 17a, and the charge of Cr 7a is reset. As a fourth state, when the S2 signal goes low and the S3 signal goes high feedback switch 34a is turned on, a feedback signal from a DA converter is input to Cr 7a, and DC offset, differential offset, and so forth can be compensated for. Cr 7a repeatedly performs the operations of these four states, and Cr 7b, 7c, and 7d also repeatedly perform operations of four states in a similar way. The difference in the repeated operations of Cr 7a through 7d is that different operations are performed at the same timing. Specifically, when the S0 signal is high, Cr 7a integrates a signal from sampling switch 5, Cr 7b has a feedback signal input to it, Cr 7c is grounded and its charge is reset, and Cr 7d discharges its integrated signal to Cb 15, so that Cr 7a through 7d perform different operations at the same timing.

That is to say, four parallel switched capacitor circuits including Cr 7a through Cr 7d implement four states by means of 4-phase operation. Also, the S0 signal through S3 signal are used respectively in "integration", "discharge", "reset", and "feedback" operations for Cr 7a through 7d respectively, and are thus used in common. By this means, the kinds of control signals output by DCU 104 are reduced, and the circuit scale can be made smaller. Also, a first stage IIR filter is configured by connection of Ch 6 and Cr 7a through 7d sequentially, and a second stage IIR filter is configured by connection of Cb 15 and Cr 7a through 7d sequentially. The transfer function at this time is shown by the following equation.

(Equation 6)

$$H = \frac{gm}{\pi f_{RF}} H_{IIR1} H_{IIR2} \quad [6]$$
$$= \frac{gm}{\pi f_{RF}} \frac{1}{(C_H + C_R) - C_H z^{-1}} \frac{C_R}{(C_R + C_B) - C_B z^{-1}}$$

At this time, the switched capacitor section 102 output signal sampling frequency is decided by the timing at which a signal is discharged to Cb—that is, the timing at which Cr 7a through 7d and Cb are connected. According to FIG. 8, Cb and Cr 7a through 7d are connected at the same frequency as the LO signal frequency, and operation without decimation is possible.

From the above, according to a sampling mixer of this embodiment, switched capacitor circuitry including Cr 7a through 7d arranged in four parallel arrays performs 4-phase operation whereby mutually different operations are performed at the same timing, and control signals driving the switched capacitor circuitry are used in common, thereby enabling the circuit scale of DCU 104 to be reduced. Also, the same waveform can be used for signals S0 through S3, and it is not necessary to provide control signals having different waveforms. Furthermore, the REF signal frequency can be lowered to the same frequency as the LO signal even in a non-decimation circuit configuration.

By this means, non-decimation operation is also possible in a real circuit, a folding frequency can be distanced from a desired band, and degradation of reception sensitivity due to a fold-back component can be suppressed.

In this embodiment, an element forming a switch has been assumed to be an n-type FET, but a p-type element may also be used, or a combination of n-type and p-type elements may be used. Furthermore, a micro electro mechanical system (MEMS) may also be used.

In this embodiment, a sampling mixer in which a sampling switch is connected has been assumed, but a discrete filter to which a BB signal is input may also be used without using a sampling switch. A BB signal is a received signal that has been converted from an RF frequency band to the BB frequency band, and may be a temporally continuous signal or a discrete signal.

In this embodiment, Ch, Cr, and Cb have been described as parallel plate capacitors, but these may also be capacitors using an n-type FET or capacitors using a p-type FET.

In this embodiment, Ch, Cr, and Cb have been described as having fixed values, but a configuration may also be used in which a plurality of capacitors and switches are provided and capacitor values are switched.

(Embodiment 2)

Figure 9:
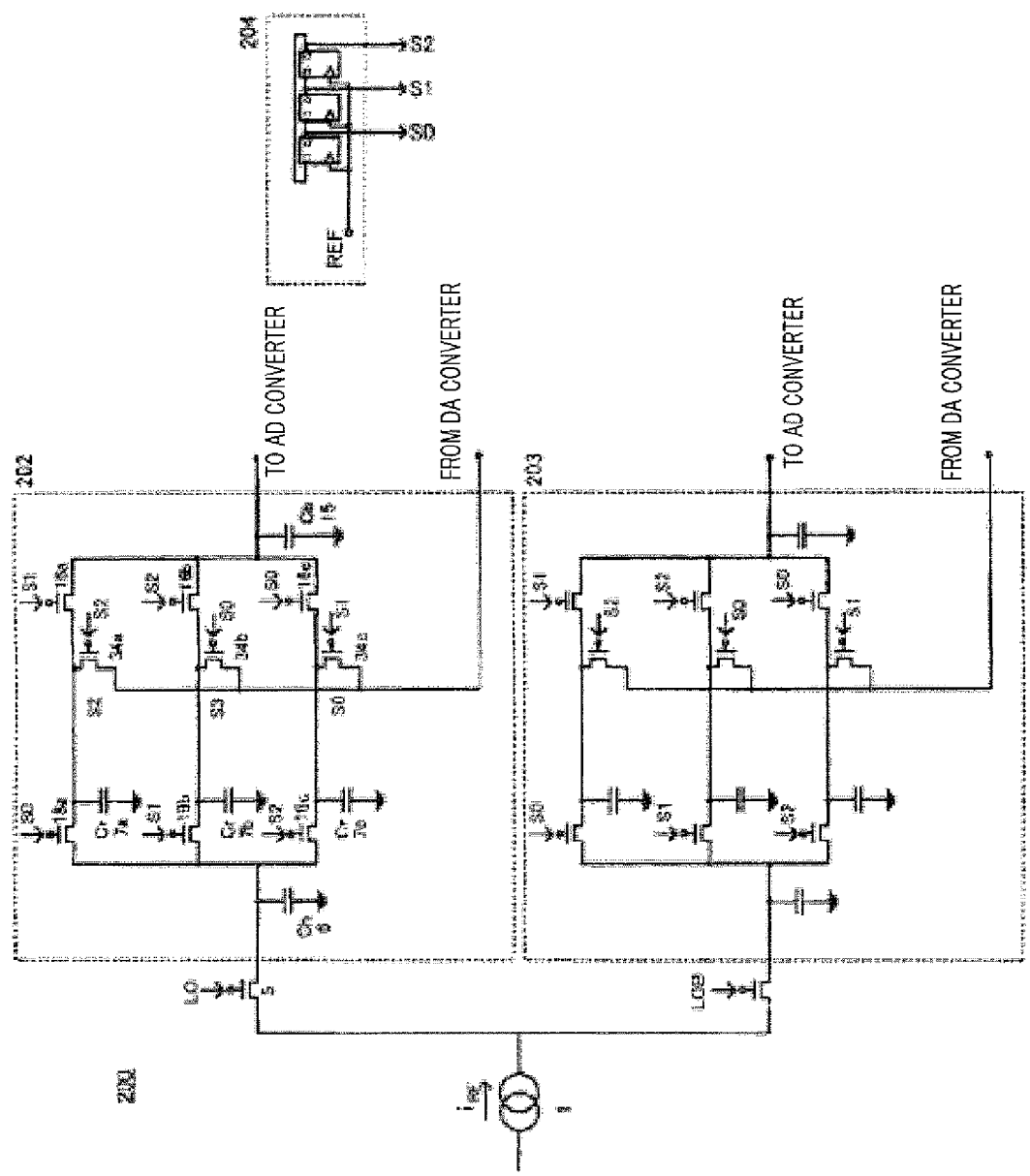
FIG. 9 is a circuit diagram of a sampling mixer according to Embodiment 2 of the present invention.

FIG. 9 is a circuit diagram showing sampling mixer 200 according to Embodiment 2 of the present invention. Here, points of difference from Embodiment 1 will chiefly be described.

Sampling mixer 200 is provided with switched capacitor sections 202 and 203 and DCU 204 instead of switched capacitor sections 102 and 103 and DCU 104 according to Embodiment 1 shown in FIG. 7.

Switched capacitor section 202 has a configuration in which Cr 7d, damping switch 16d, reset switches 17a through 17d, integration switch 18d, and feedback switch 34d are omitted from switched capacitor section 102 of Embodiment 1. Switched capacitor section 203 also has a similar configuration.

DCU 204 outputs signals of three phases (an S0 signal, S1 signal, and S2 signal) to switched capacitor sections 202 and 203.

A difference from Embodiment 1 in the operation of sampling mixer 200 is that three parallel switched capacitor circuits including Cr 7a through Cr 7c implement three states of "integration", "discharge", and "feedback" by means of 3-phase operation. If the feedback signal is a DC voltage signal, the operation is the same whether or not there is a reset operation. Therefore, a reset operation can be omitted from switched capacitor circuit operations, and the number of switched capacitor circuitry in parallel arrays can be reduced.

From the above, according to a sampling mixer of this embodiment, switched capacitor circuitry including Cr 7a through 7c arranged in three parallel arrays performs 3-phase operation whereby mutually different operations are performed at the same timing, and in addition to obtaining the effects of Embodiment 1 it is possible to further reduce the circuit scale.

In this embodiment, a DA converter output signal is used as a feedback signal, but a DC voltage source voltage may also be used as a feedback signal.

In this embodiment, three parallel switched capacitor circuits implement three states of integration, discharge, and feedback by means of 3-phase operation, but two states of integration and discharge may also be implemented by means of 2-phase operation with two switched capacitor circuits in parallel, omitting a feedback switch. What is important is that when the number of switched capacitor circuitry operation states is N, the number of switched capacitor circuitry in parallel arrays is N, there are N control signals having the same frequency and different phases output by the DCU, and different operations are performed at the same timing. By this means, non-decimation operation of a sampling mixer can be performed with a REF signal having the same frequency as the LO (Embodiment 3)

Figure 10:
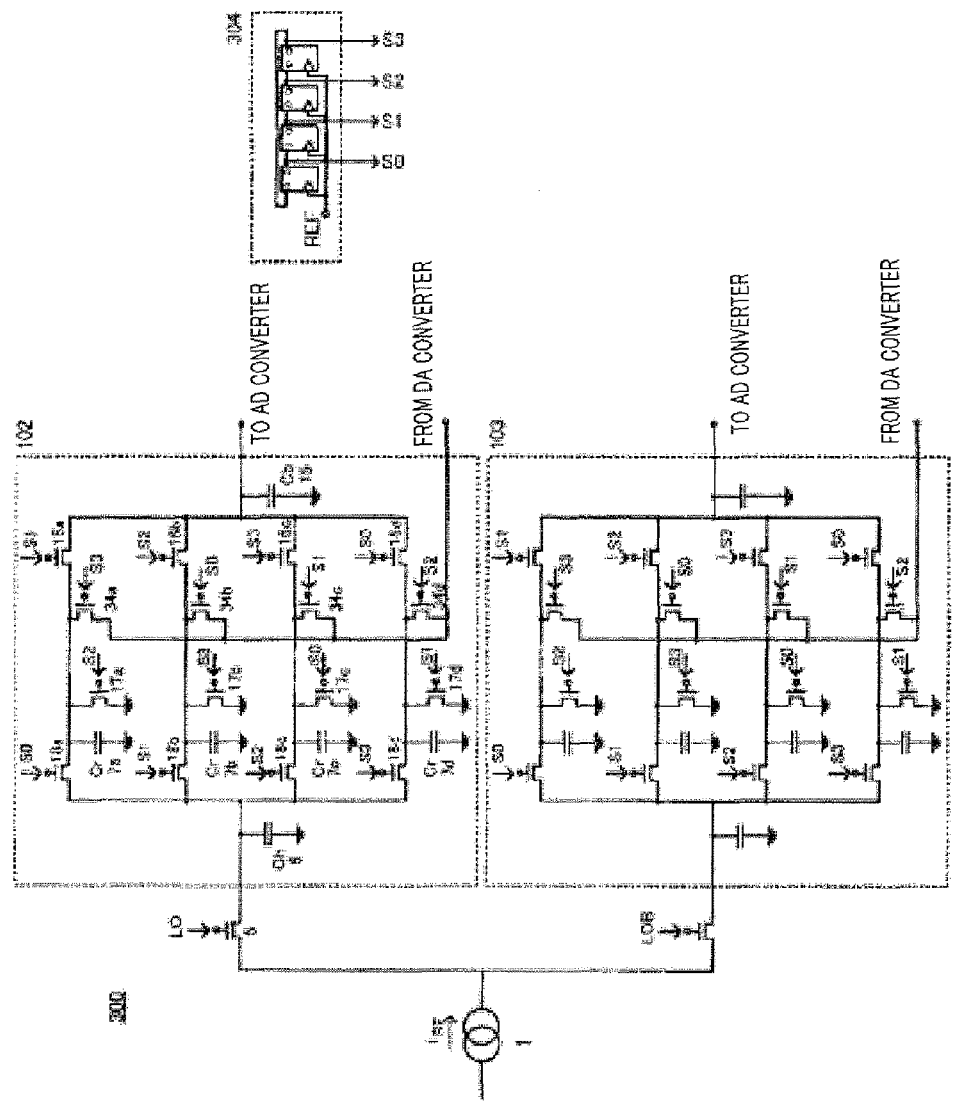
FIG. 10 is a circuit diagram of a sampling mixer according to Embodiment 3 of the present invention.

FIG. 10 is a circuit diagram showing sampling mixer 300 according to Embodiment 3 of the present invention. Here, points of difference from Embodiment 1 will chiefly be described.

Sampling mixer 300 is provided with DCU 304 instead of DCU 104 according to Embodiment 1 shown in FIG. 7.

Figure 11:
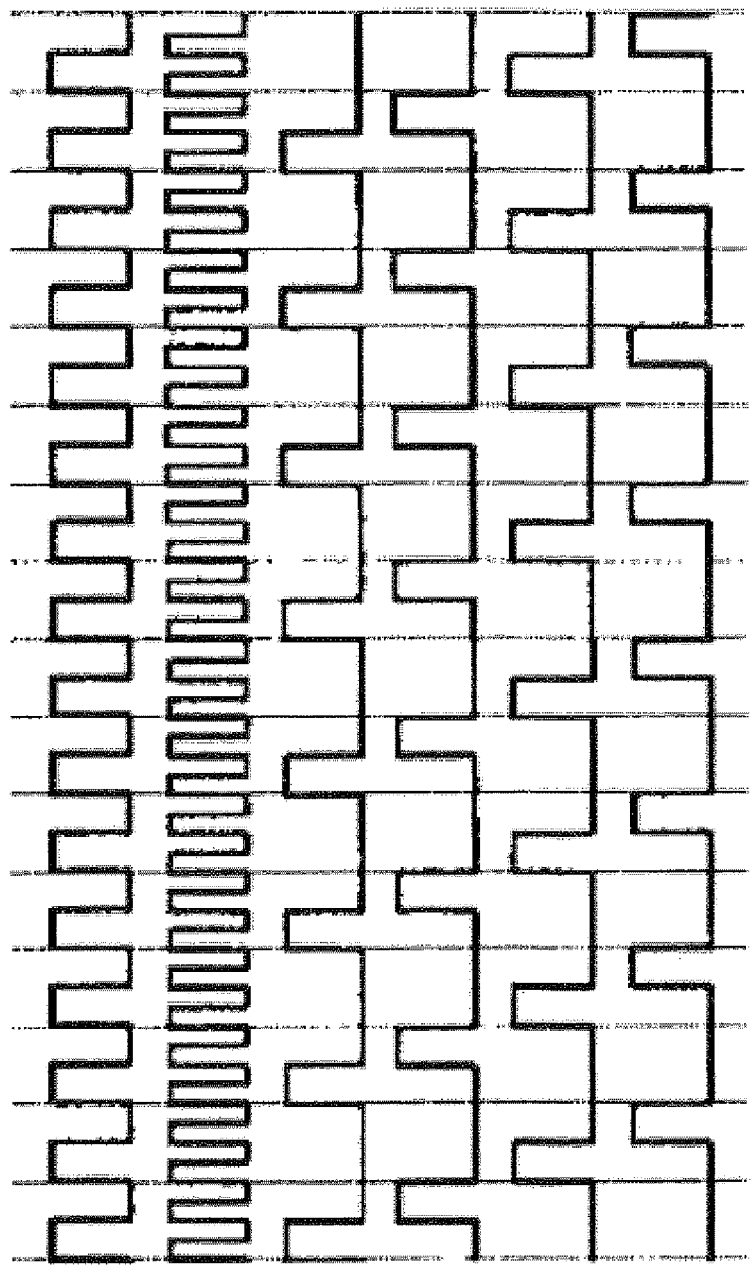
FIG. 11 is a timing chart of control signals according to Embodiment 3 of the present invention.

FIG. 11 is a timing chart of control signals used in sampling mixer 300 according to Embodiment 3 of the present invention.

DCU 304 has a REF signal having twice the frequency of the LO signal input to it, and the time during which signals S0 through S3 are high is half an LO signal period. Compared with a conventional sampling mixer, the kinds of control signals necessary for operation are decreased, and the operation of sampling mixer 300 of this embodiment can be speeded up in proportion to the decrease in the frequency of the REF signal necessary for the DCU. By this means, the output signal sampling frequency increases, and a folding frequency becomes a frequency distanced from the desired band by twice the LO signal frequency.

Figure 12:
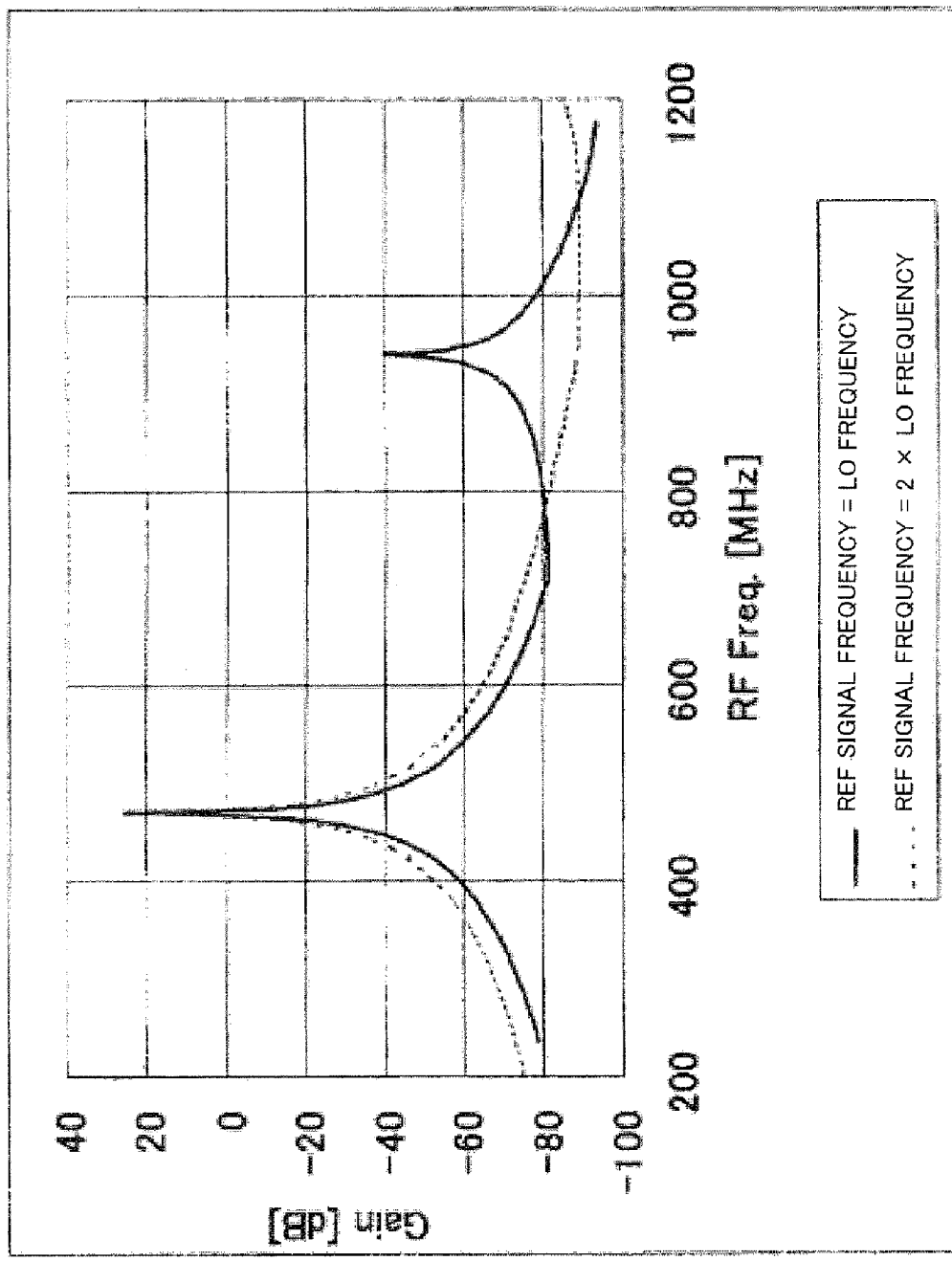
FIG. 12 is a characteristic graph of a sampling mixer according to Embodiment 3 of the present invention.

FIG. 12 is a drawing showing a characteristic of sampling mixer 300 of Embodiment 3 (REF signal frequency=2×LO frequency) together with a characteristic of sampling mixer 100 of Embodiment 1 (REF signal frequency=LO frequency). As can be seen from FIG. 12, a fold-back peak appears at 940 MHz in the case of the Embodiment 1 characteristic, whereas a fold-back peak does not appear at 940 MHz in the case of the Embodiment 3 characteristic.

From the above, according to a sampling mixer of this embodiment, operation can be speeded up in proportion to the decrease in the frequency of the REF signal necessary for the DCU, and a folding frequency can be further distanced from a desired frequency than in the case of Embodiment 1.

(Embodiment 4)

Figure 13:
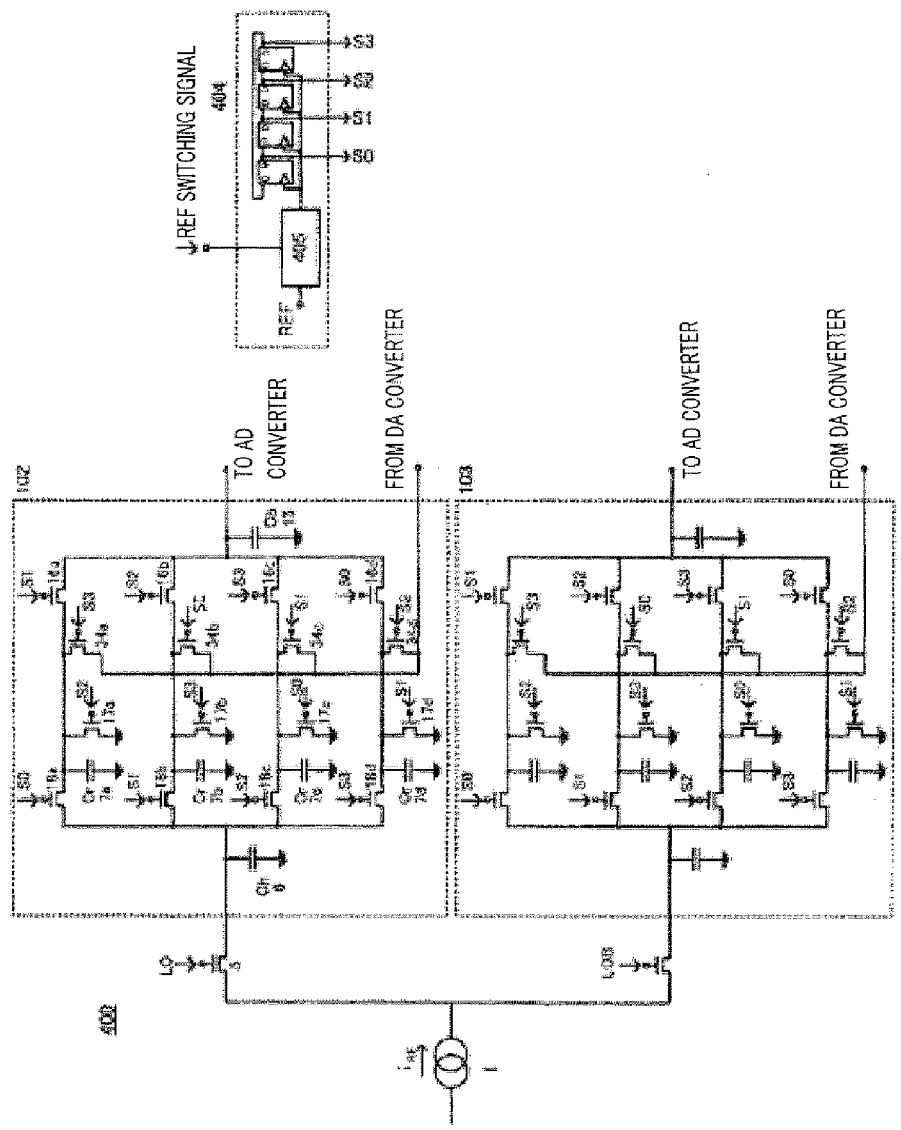
FIG. 13 is a circuit diagram of a sampling mixer according to Embodiment 4 of the present invention.

FIG. 13 is a circuit diagram showing sampling mixer 400 according to Embodiment 4 of the present invention. Here, points of difference from Embodiment 1 will chiefly be described.

Sampling mixer 400 is provided with DCU 404 instead of DCU 104 according to Embodiment 1 shown in FIG. 7.

DCU 404 is provided with variable frequency divider 405 that switches the frequency of a REF signal input to a shift register that generates signals of four phases. Variable frequency divider 405 varies frequency division based on a REF switching signal output from a signal processing section (not shown).

Figure 14:
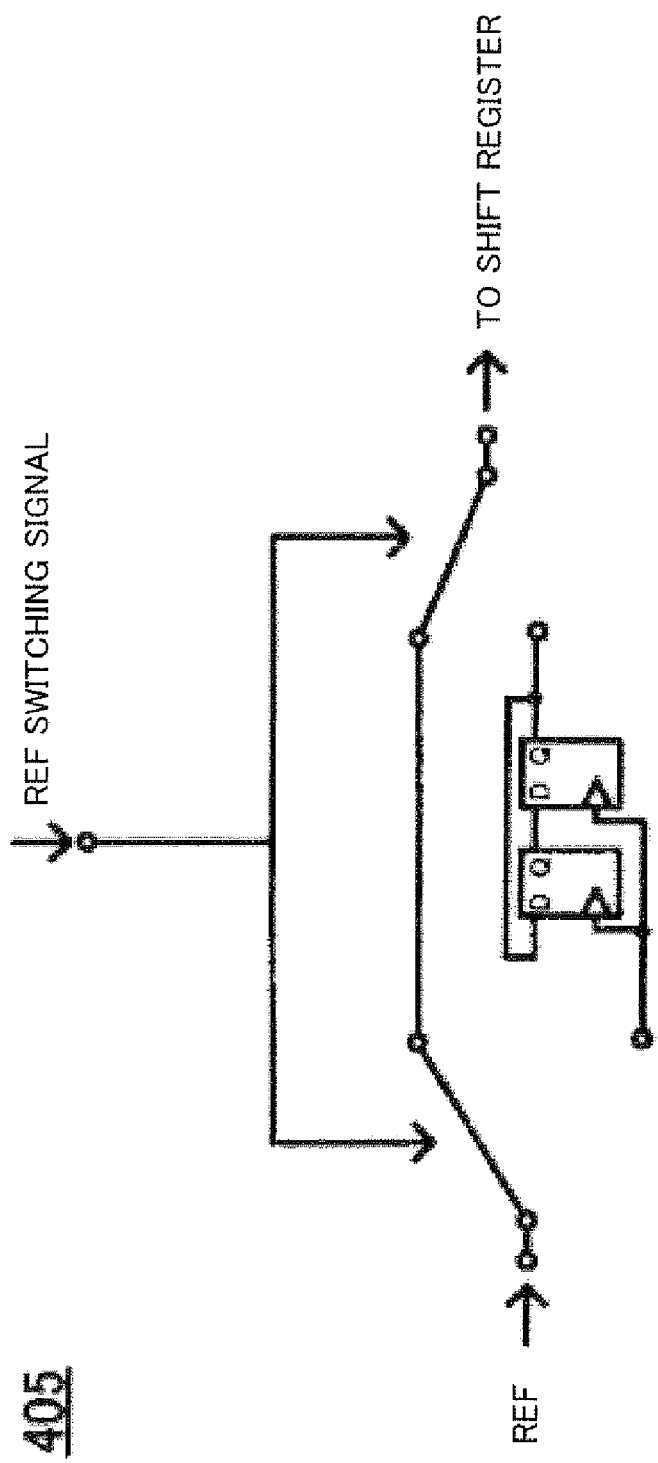
FIG. 14 is a block diagram of a variable frequency divider according to Embodiment 4 of the present invention.

FIG. 14 is a block diagram showing an example of variable frequency divider 405. According to FIG. 14, variable frequency divider 405 has a configuration such that switching is performed between a path whereby the REF signal is output to the shift register without being divided, and a path whereby the REF signal is output to the shift register after being divided by two. The frequency of a signal input to the shift register is varied by switching between these paths based on the REF switching signal. In this embodiment, switching is performed between a non-division path and a division-by-two path, but the present invention is not limited to this, and switching may also be performed using other frequency division paths.

Figure 15:
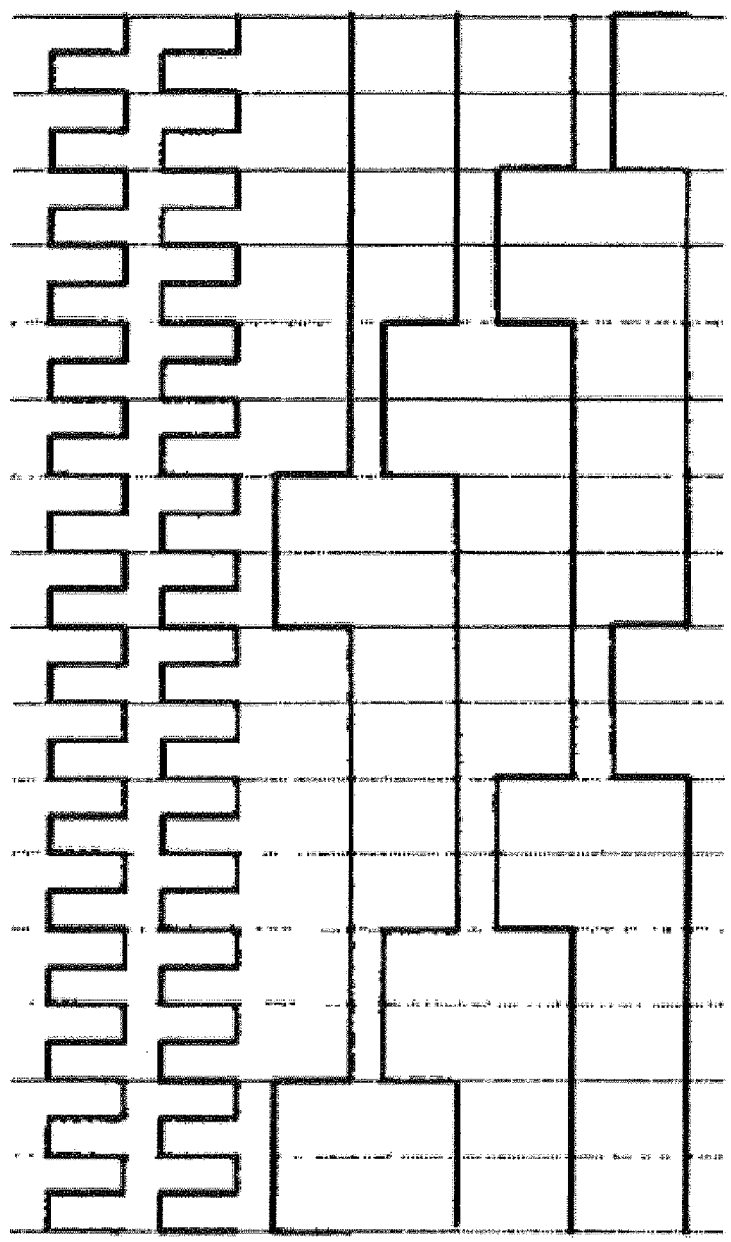
FIG. 15 is a timing chart of control signals according to Embodiment 4 of the present invention.

FIG. 15 is a timing chart of control signals used when sampling mixer 400 performs 2-decimation operation. This operation corresponds to operation in which the frequency of a REF signal input to the shift register is divided by two. According to FIG. 15, the time during which signals S0 through S3 are high is two LO signal periods, and discrete signals are integrated during this time. This operation implements a 2-tap FIR filter, and 2-decimation is performed. The transfer function in this case is shown by the following equation.

(Equation 7)

$$H_{FIR1} = \frac{1-z^{-2}}{1-z^{-1}} \quad [7]$$

The overall transfer function of sampling mixer 400 performing 2-decimation operation at this time is shown by the following equation.

(Equation 8)

$$H = \frac{gm}{\pi f_{RF}} H_{FIR1} H_{IIR1} H_{IIR2} \quad [8]$$

$$= \frac{gm}{\pi f_{RF}} \frac{1-z^{-2}}{1-z^{-1}} \frac{1}{(C_H+C_R)-C_H z^{-2}} \frac{C_R}{(C_R+C_B)-C_B z^{-2}}$$

The operation of sampling mixer 400 will now be described. As an example, when sampling mixer 400 is used for UHF terrestrial digital broadcast reception, the reception band is 470 MHz (channel 13) to 770 MHz (channel 62). When receiving a low-frequency channel at this time, if decimation is performed a signal of another channel is folded back in the desired band and causes degradation of reception sensitivity, and therefore non-decimation operation is necessary.

When receiving a high-frequency channel, a folding frequency due to decimation can be made 770 MHz or higher and decimation can be performed, and degradation of reception sensitivity can be suppressed by supplementing gain that falls at a high frequency according to $1/f_{RF}$ (see Equation (8)) with FIR filter gain through decimation.

From the above, according to a sampling mixer of this embodiment, by switching the frequency of a signal input to the shift register of the DCU it is possible to switch the number of decimations, and it is possible to suppress degradation of reception sensitivity due to a fold-back component by means of non-decimation operation during low-frequency channel reception, and to suppress degradation of reception sensitivity due to gain degradation by means of decimation operation during high-frequency channel reception.

In this embodiment, terrestrial digital broadcast reception has been described, but this embodiment may also be applied to a different radio system.

In this embodiment, terrestrial digital broadcasting has been taken as an example and provision has been made for a folding frequency not to appear within another channel band in the same radio system, but provision may also be made for a folding frequency not to appear within a band of a radio system other than the receiving radio system.

(Embodiment 5)

Figure 16:
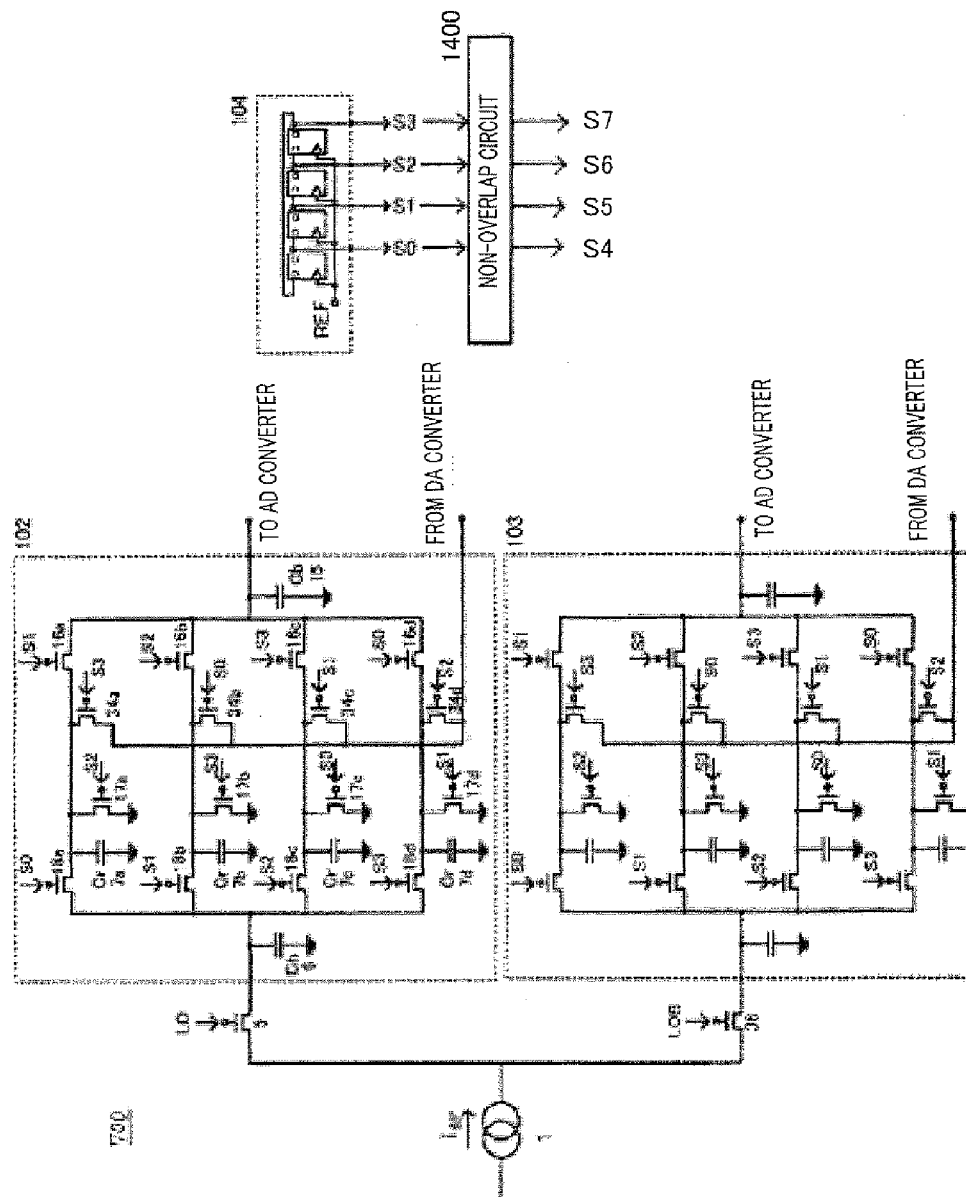
FIG. 16 is a circuit diagram of a sampling mixer according to Embodiment 5 of the present invention.

FIG. 16 is a circuit diagram showing sampling mixer 700 according to Embodiment 5 of the present invention. Sampling mixer 700 has non-overlap circuit 1400 added to sampling mixer 100 according to Embodiment 1 shown in FIG. 7.

Here, even if the number of decimations is made low, a frequency component of M/N times the sampling frequency (where M and N are mutually different natural numbers) is superimposed on a control signal driving the sampling mixer, and therefore an interference signal present at a frequency of M/N times the sampling frequency is generated within the received signal band after frequency conversion. Since this causes degradation of reception sensitivity, it is necessary to suppress a component of M/N times the sampling frequency superimposed on a control signal. Thus, sampling mixer 700 is provided with non-overlap circuit 1400.

Sample configurations of a non-overlap circuit according to this embodiment will now be described.

CONFIGURATION EXAMPLE 1

Figure 17:
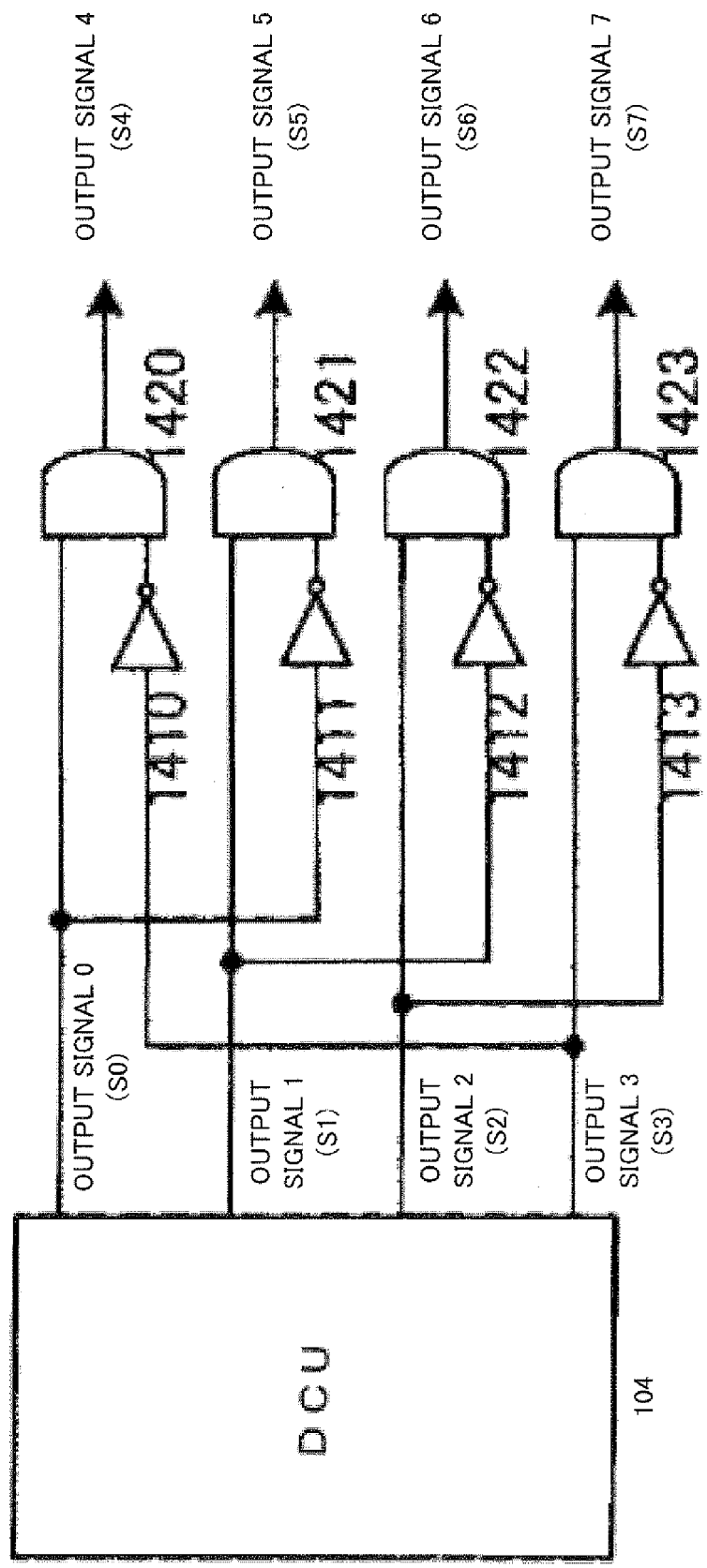
FIG. 17 is a block diagram showing a configuration of a non-overlap circuit according to Embodiment 5 of the present invention (Configuration Example 1)

Non-overlap Circuit 1400-1 (FIG. 17)

In FIG. 17, non-overlap circuit 1400-1 has NOT gates 1410, 1411, 1412, and 1413, and AND gates 1420, 1421, 1422, and 1423.

Output signal 4 is the result of an AND operation on output signal 3 output from DCU 104 via NOT gate 1410 and output signal 0 output from DCU 104. Therefore, when output signal 0 is 1, output signal 4 does not become 1 until output signal 3 becomes 0. Also, if output signal 2 is 0, output signal 7 becomes 1 when output signal 3 is 1. Thus, the configuration prevents output signal 7 and output signal 4 from becoming 1 at the same time.

Output signal 5 is the result of an AND operation on output signal 0 output from DCU 104 via NOT gate 1411 and output signal 1 output from DCU 104. Therefore, when output signal 1 is 1, output signal 5 does not become 1 until output signal 0 becomes 0. Also, if output signal 3 is 0, output signal 4 becomes 1 when output signal 0 is 1. Thus, the configuration prevents output signal 4 and output signal 5 from becoming 1 at the same time.

Output signal 6 is the result of an AND operation on output signal 1 output from DCU 104 via NOT gate 1412 and output signal 2 output from DCU 104. Therefore, when output signal 2 is 1, output signal 6 does not become 1 until output signal 1 becomes 0. Also, if output signal 0 is 0, output signal 5 becomes 1 when output signal 1 is 1. Thus, the configuration prevents output signal 5 and output signal 6 from becoming 1 at the same time.

Output signal 7 is the result of an AND operation on output signal 2 output from DCU 104 via NOT gate 1413 and output signal 3 output from DCU 104. Therefore, when output signal 3 is 1, output signal 7 does not become 1 until output signal 2 becomes 0. Also, if output signal 1 is 0, output signal 6 becomes 1 when output signal 2 is 1. Thus, the configuration prevents output signal 6 and output signal 7 from becoming 1 at the same time.

Figure 18:
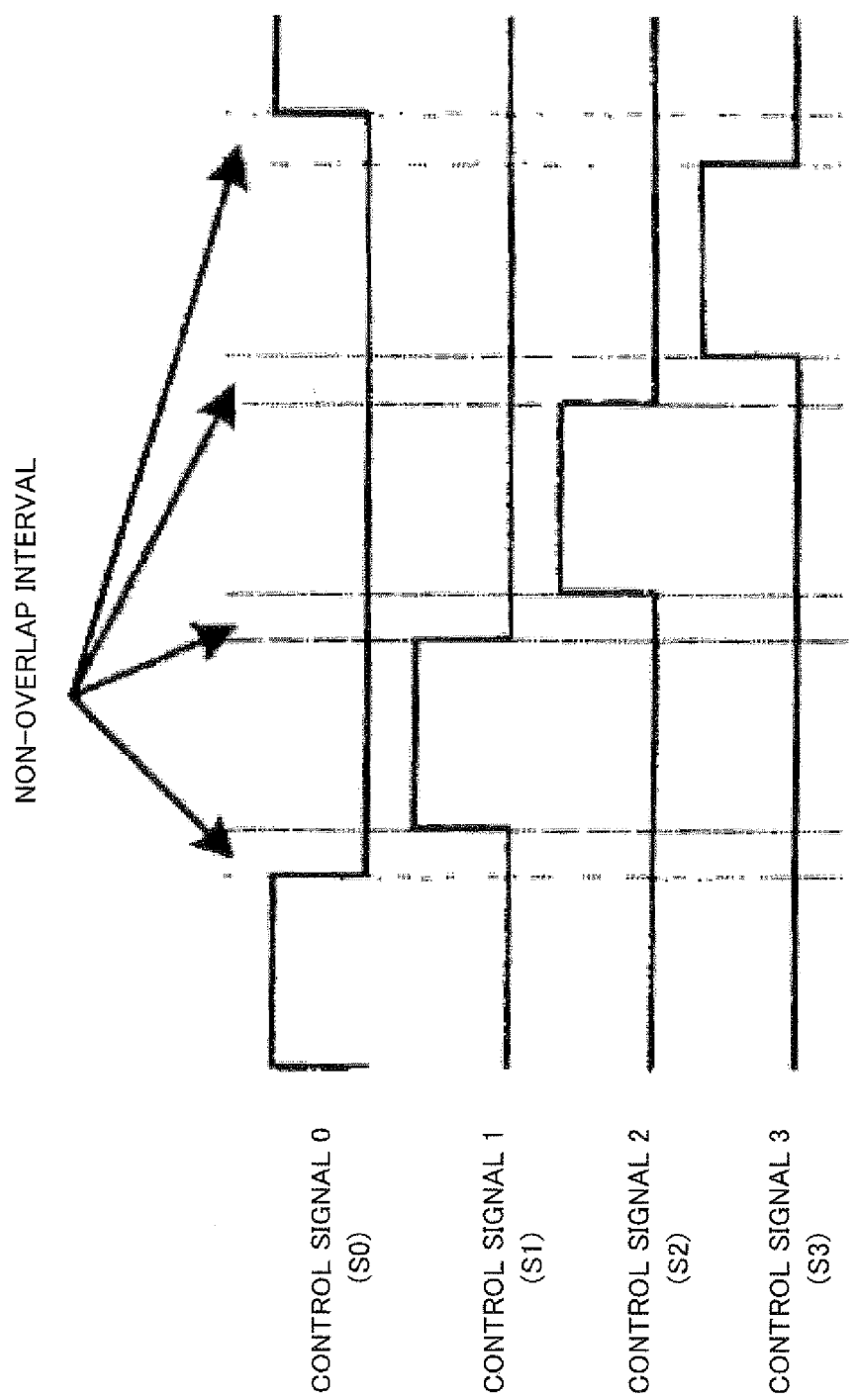
FIG. 18 is a drawing showing control signals according to Embodiment 5 of the present invention.

By using output signals 4 through 7 generated in this way as control signals 0 through 3, a control signal group having the non-overlap intervals shown in FIG. 18 can be generated.

CONFIGURATION EXAMPLE 2

Figure 19:
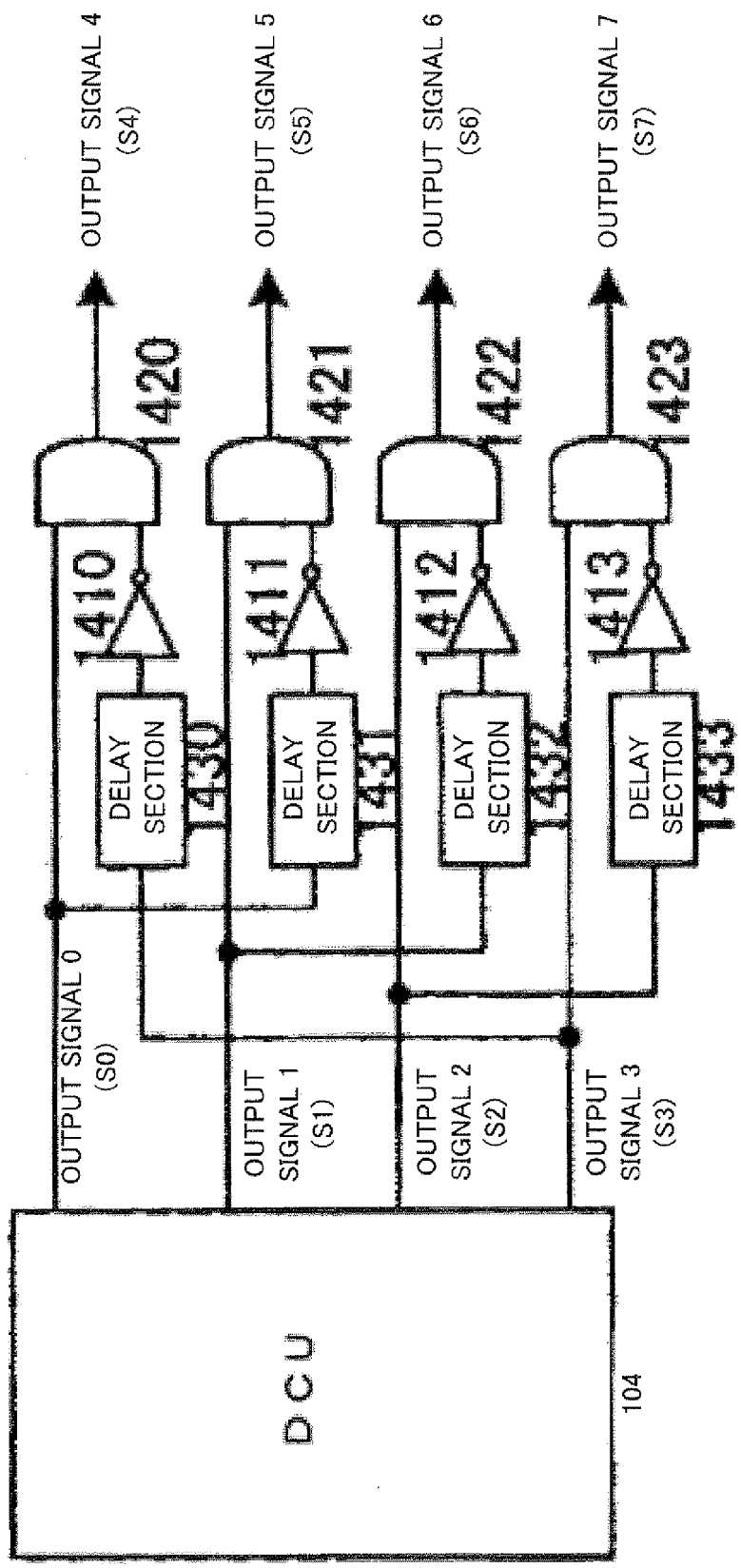
FIG. 19 is a block diagram showing a configuration of a non-overlap circuit according to Embodiment 5 of the present invention (Configuration Example 2)

Non-overlap Circuit 1400-2 (FIG. 19)

In FIG. 19, non-overlap circuit 1400-2 has delay sections 1430, 1431, 1432, and 1433 in addition to the configuration shown in FIG. 17.

Output signal 4 is the result of an AND operation on a signal resulting from delaying output signal 3 output from DCU 104 via NOT gate 1410 using delay section 1430, and output signal 0 output from DCU 104. Therefore, when output signal 0 is 1, output signal 4 does not become 1 until the signal resulting from delaying output signal 3 becomes 0. Also, if output signal 2 is 0, output signal 7 becomes 1 when output signal 3 is 1. Thus, there is an interval equivalent to the delay section 1430 delay time (a non-overlap interval) between the on-time of output signal 7 and the on-time of output signal 4.

Output signal 5 is the result of an AND operation on a signal resulting from delaying output signal 0 output from DCU 104 via NOT gate 1411 using delay section 1431, and output signal 1 output from DCU 104. Therefore, when output signal 1 is 1, output signal 5 does not become 1 until the signal resulting from delaying output signal 0 becomes 0. Also, if output signal 3 is 0, output signal 4 becomes 1 when output signal 0 is 1. Thus, there is an interval equivalent to the delay section 1431 delay time (a non-overlap interval) between the on-time of output signal 4 and the on-time of output signal 5.

Output signal 6 is the result of an AND operation on a signal resulting from delaying output signal 1 output from DCU 104 via NOT gate 1412 using delay section 1432, and output signal 2 output from DCU 104. Therefore, when output signal 2 is 1, output signal 6 does not become 1 until the signal resulting from delaying output signal 1 becomes 0. Also, if output signal 0 is 0, output signal 5 becomes 1 when output signal 1 is 1. Thus, there is an interval equivalent to the delay section 1432 delay time (a non-overlap interval) between the on-time of output signal 5 and the on-time of output signal 6.

Output signal 7 is the result of an AND operation on a signal resulting from delaying output signal 2 output from DCU 104 via NOT gate 1413 using delay section 1433, and output signal 3 output from DCU 104. Therefore, when output signal 3 is 1, output signal 7 does not become 1 until the signal resulting from delaying output signal 2 becomes 0. Also, if output signal 1 is 0, output signal 6 becomes 1 when output signal 2 is 1. Thus, there is an interval equivalent to the delay section 1433 delay time (a non-overlap interval) between the on-time of output signal 6 and the on-time of output signal 7.

By using output signals 4 through 7 generated in this way as control signals 0 through 3, the width of the non-overlap intervals shown in FIG. 18 can be varied according to a delay amount provided by delay sections 1430 through 1433.

Figure 20:
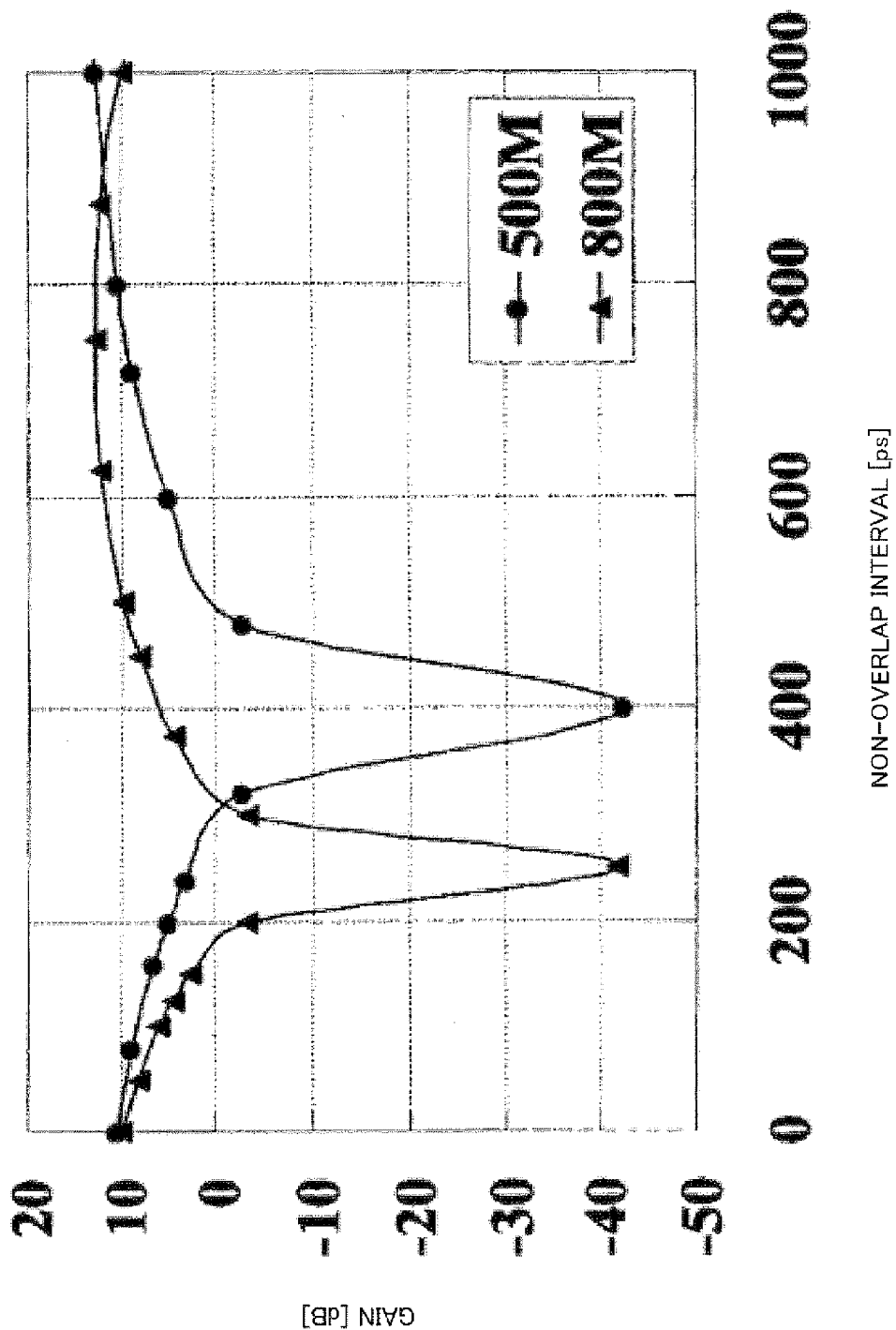
FIG. 20 is a drawing showing the relationship between specific frequency component gain and a non-overlap interval according to Embodiment 5 of the present invention.

Next, a description will be given of operating frequency× 5/4 frequency component gain when a non-overlap interval is varied, using FIG. 20. FIG. 20 shows plots of operating frequency×5/4 frequency component gain when the non-overlap interval of signals S0 through S3 is varied for cases where the operating frequency of sampling switches 5 and 36 is 500 [MHz] and 800 [MHz]. It can be seen that there is an optimum non-overlap interval value that lowers gain of a specific frequency component according to the operating frequency. For example, when the operating frequency is 500 [MHz], gain is at a minimum when the non-overlap interval value is 400 ps (picoseconds), and when the operating frequency is 800 [MHz], gain is at a minimum when the non-overlap interval value is 250 ps (picoseconds).

For example, the optimum non-overlap interval value that lowers gain of an operating frequency×M/4 (that is, N=4) frequency component is shown by Equation (9).

Optimum non-overlap interval=period×(1−4/M)        (Equation 9)

By setting a non-overlap interval of each control signal so that gain of a specific frequency component becomes a minimum in this way, it is possible to reduce superimposition of a specific frequency component.

There are no particular restrictions on the number of delay sections for setting a specific non-overlap interval. Here, as an example, a description has been given of the case of gain of a sampling frequency×5/4 frequency component in a sampling mixer performing period×4 cycle operation, but in the case of period×N cycle operation, also, it is possible to reduce superimposition of a specific frequency component by setting a non-overlap interval of each control signal so that gain of a sampling frequency×M/N frequency component (where M and N are mutually different natural numbers) becomes a minimum in a similar way.

CONFIGURATION EXAMPLE 3

Figure 21:
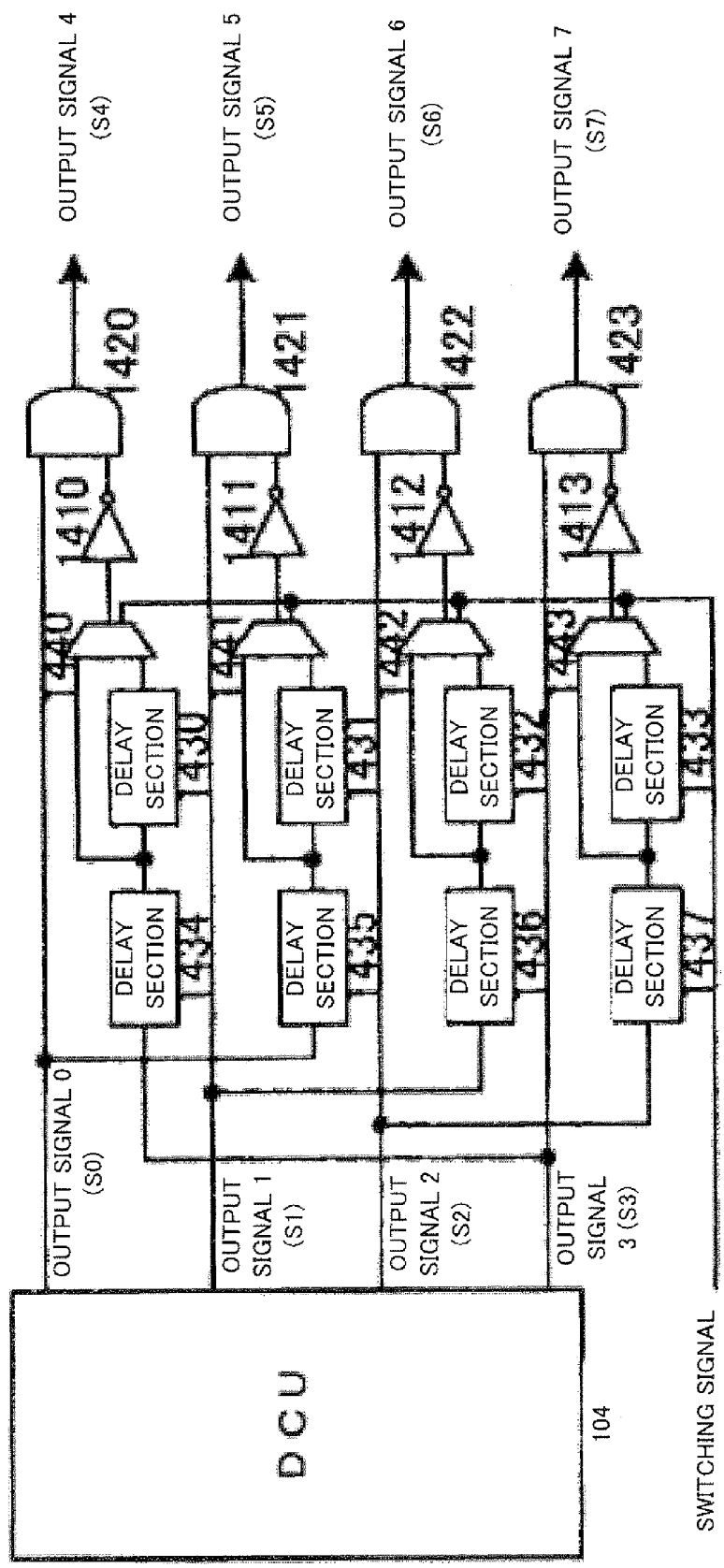
FIG. 21 is a block diagram showing a configuration of a non-overlap circuit according to Embodiment 5 of the present invention (Configuration Example 3)

Non-overlap Circuit 1400-3 (FIG. 21)

In FIG. 21, non-overlap circuit 1400-3 has delay sections 1434, 1435, 1436, and 1437, and selectors 1440, 1441, 1442, 1443, in addition to the configuration shown in FIG. 20.

Based on a switching signal, selector 1440 switches between making a signal that is output to NOT gate 1410 output that has passed through only delay section 1434, and making that signal output that has passed through both delay section 1434 and delay section 1430.

Based on a switching signal, selector 1441 switches between making a signal that is output to NOT gate 1411 output that has passed through only delay section 1435, and making that signal output that has passed through both delay section 1435 and delay section 1431.

Based on a switching signal, selector 1442 switches between making a signal that is output to NOT gate 1412 output that has passed through only delay section 1436, and making that signal output that has passed through both delay section 1436 and delay section 1432.

Based on a switching signal, selector 1443 switches between making a signal that is output to NOT gate 1413 output that has passed through only delay section 1437, and making that signal output that has passed through both delay section 1437 and delay section 1433.

When output signals 4 through 7 (S4 through S7) generated in this way are made control signals 0 through 3 (S0 through S3), and if the delay amount of delay sections 1434, 1435, 1436, and 1437 is designated a [s] and the delay amount of delay sections 1430, 1431, 1432, and 1433 is designated b [s], it becomes possible to switch between making a non-overlap interval a+b [s] and making that non-overlap interval a [s] by means of selectors 1440 through 1443. For example, when a=250 [ps] and b=150 [ps], it is possible to reduce operating frequency×5/4 frequency component gain in accordance with the operating frequency by making the non-overlap interval a [ps] when the operating frequency of sampling switches 5 and 36 is 800 [MHz], and making the non-overlap interval a+b [ps] when the operating frequency of sampling switches 5 and 36 is 500 [MHz].

According to such a configuration, it is possible to reduce superimposition of a specific frequency component according to the operating frequency by switching the width of a non-overlap interval of each control signal. Also, if the operating frequency is fixed, it is possible to switch a frequency component that reduces superimposition.

The number of delay sections for setting a specific non-overlap interval is not limited to the above example, and there are no particular restrictions on the number that can be selected by a selector.

This concludes a description of configuration examples of non-overlap circuit 1400.

According to such configurations, it is possible to provide a non-overlap interval such that control signal on-times do not overlap during the on-times of each control signal. Also, providing a non-overlap interval enables control signal sampling frequency M/N-multiple components to be suppressed.

The above non-overlap circuit configurations are only examples, and there are no particular restrictions on the configuration as long as it is capable of generating the same kind of control signals.

FIG. 20 and Equation (9) are applicable when a control signal is an ideal rectangular wave, and an optimum value for minimizing gain of a specific frequency component differs according to circuit characteristics. In this case, it is necessary to find an optimum value by varying the non-overlap interval.

Figure 22:
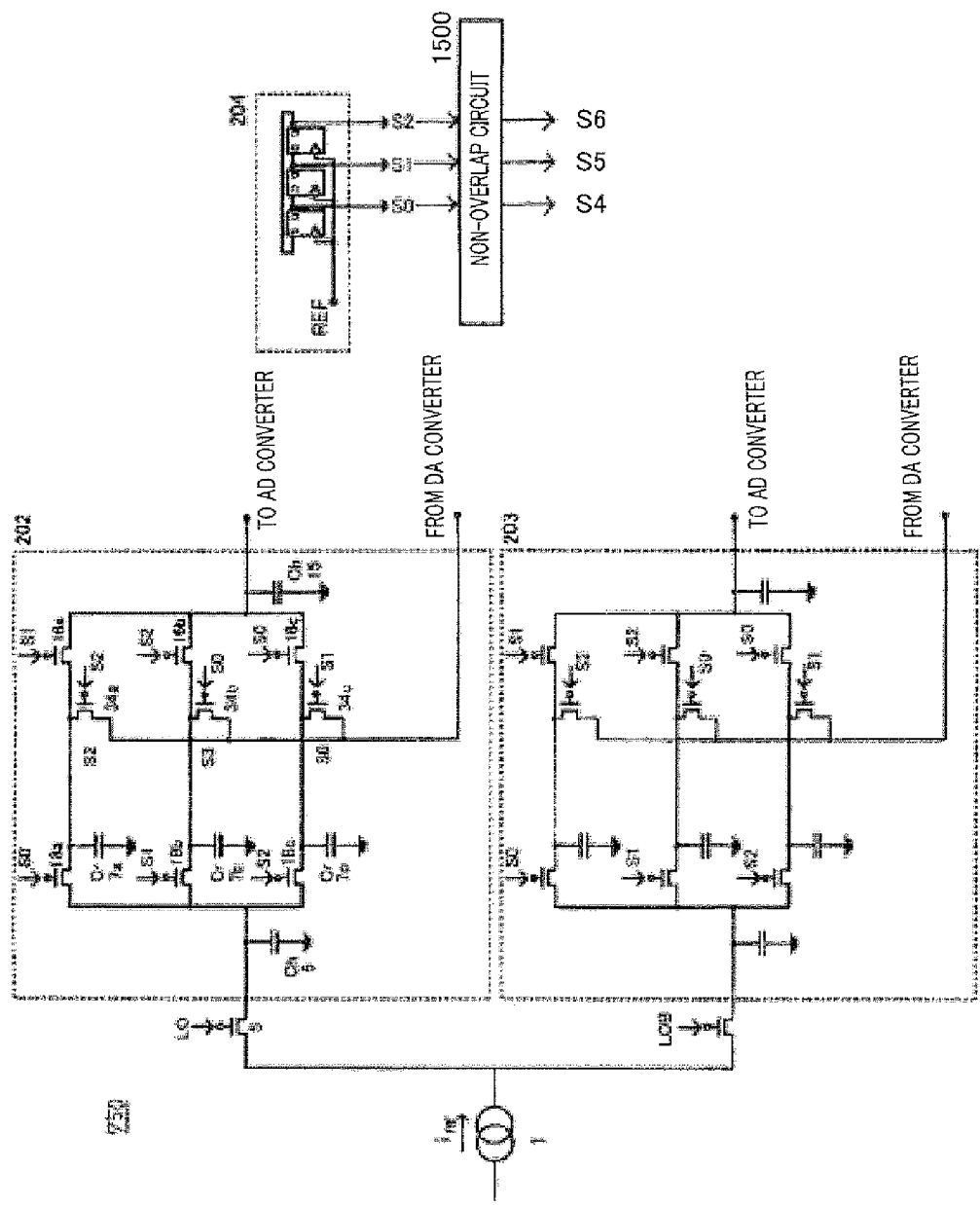
FIG. 22 is a circuit diagram of a sampling mixer according to Embodiment 5 of the present invention.

A configuration in which a non-overlap circuit has been added to sampling mixer 200 of Embodiment 2 in FIG. 9 is shown in FIG. 22. Sampling mixer 750 shown in FIG. 22 is provided with non-overlap circuit 1500 instead of non-overlap circuit 1400 shown in FIG. 16. The configuration of non-overlap circuit 1500 makes provision for DCU 204 output to be signals of three phases (an S0 signal, S1 signal, and S2 signal), and is a configuration in which NOT gate 1413 and AND gate 1423 have been eliminated from the configuration shown in FIG. 17, a configuration in which delay section 1433, NOT gate 1413, and AND gate 1423 have been eliminated from the configuration shown in FIG. 19, or a configuration in which delay section 1437, delay section 1433, selector 1443, NOT gate 1413, and AND gate 1423 have been eliminated from the configuration shown in FIG. 21.

Figure 23:
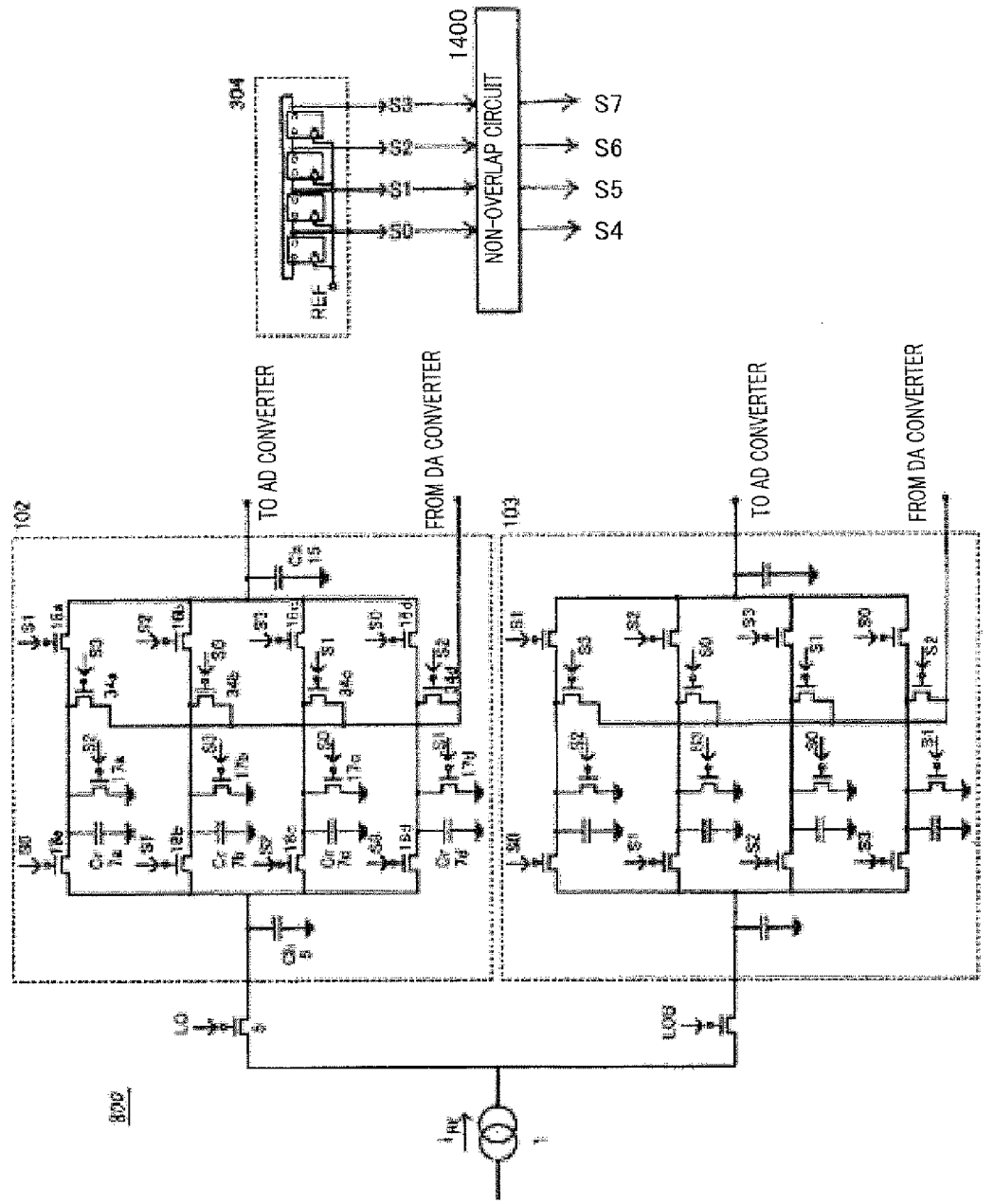
FIG. 23 is a circuit diagram of a sampling mixer according to Embodiment 5 of the present invention.

Also a configuration in which non-overlap circuit 1400 has been added to sampling mixer 300 of Embodiment 3 in FIG. 10 (sampling mixer 800) is shown in FIG. 23.

Figure 24:
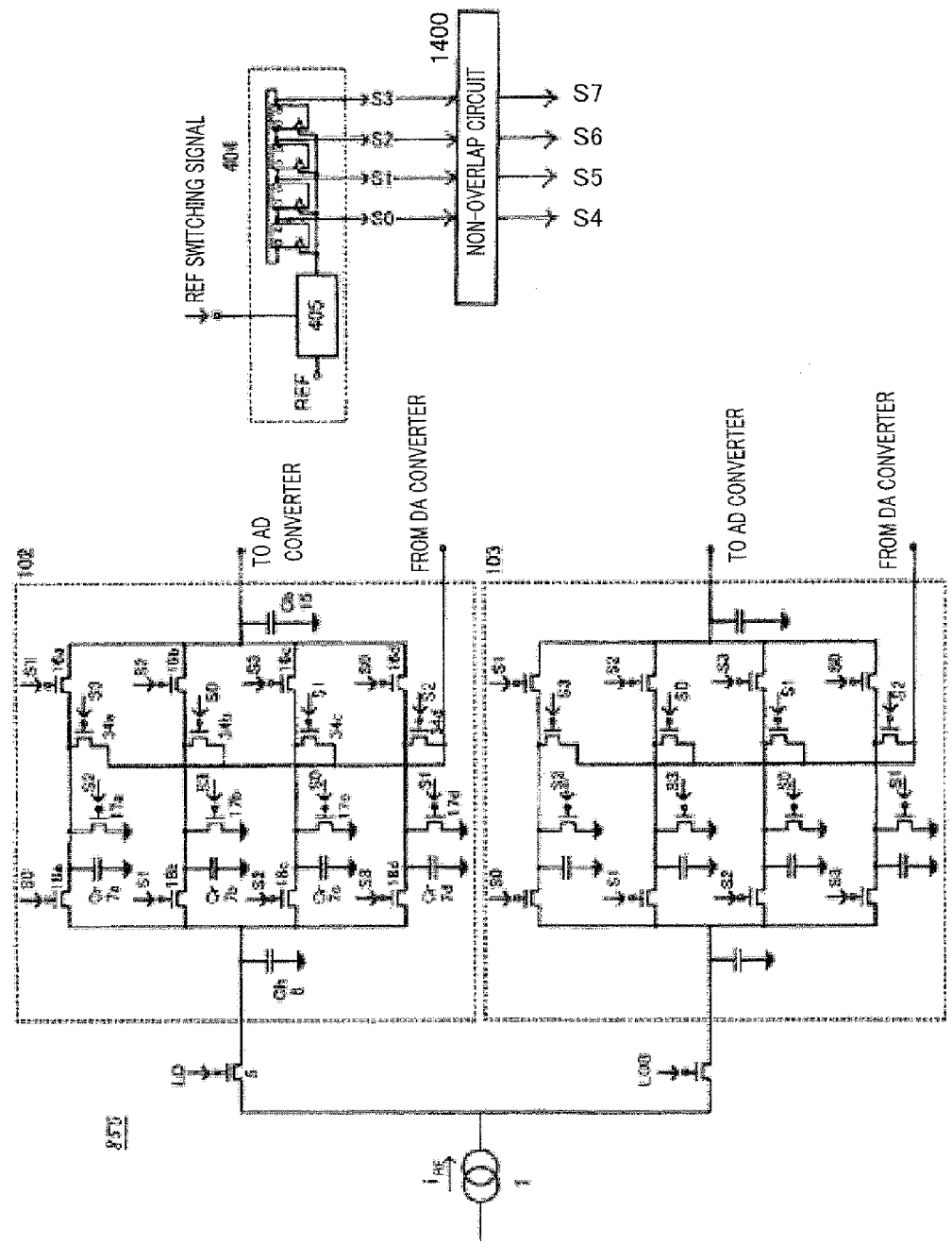
FIG. 24 is a circuit diagram of a sampling mixer according to Embodiment 5 of the present invention.

Furthermore, a configuration in which non-overlap circuit 1400 has been added to sampling mixer 400 of Embodiment 4 in FIG. 13 (sampling mixer 850) is shown in FIG. 24.

(Embodiment 6)

Figure 25:
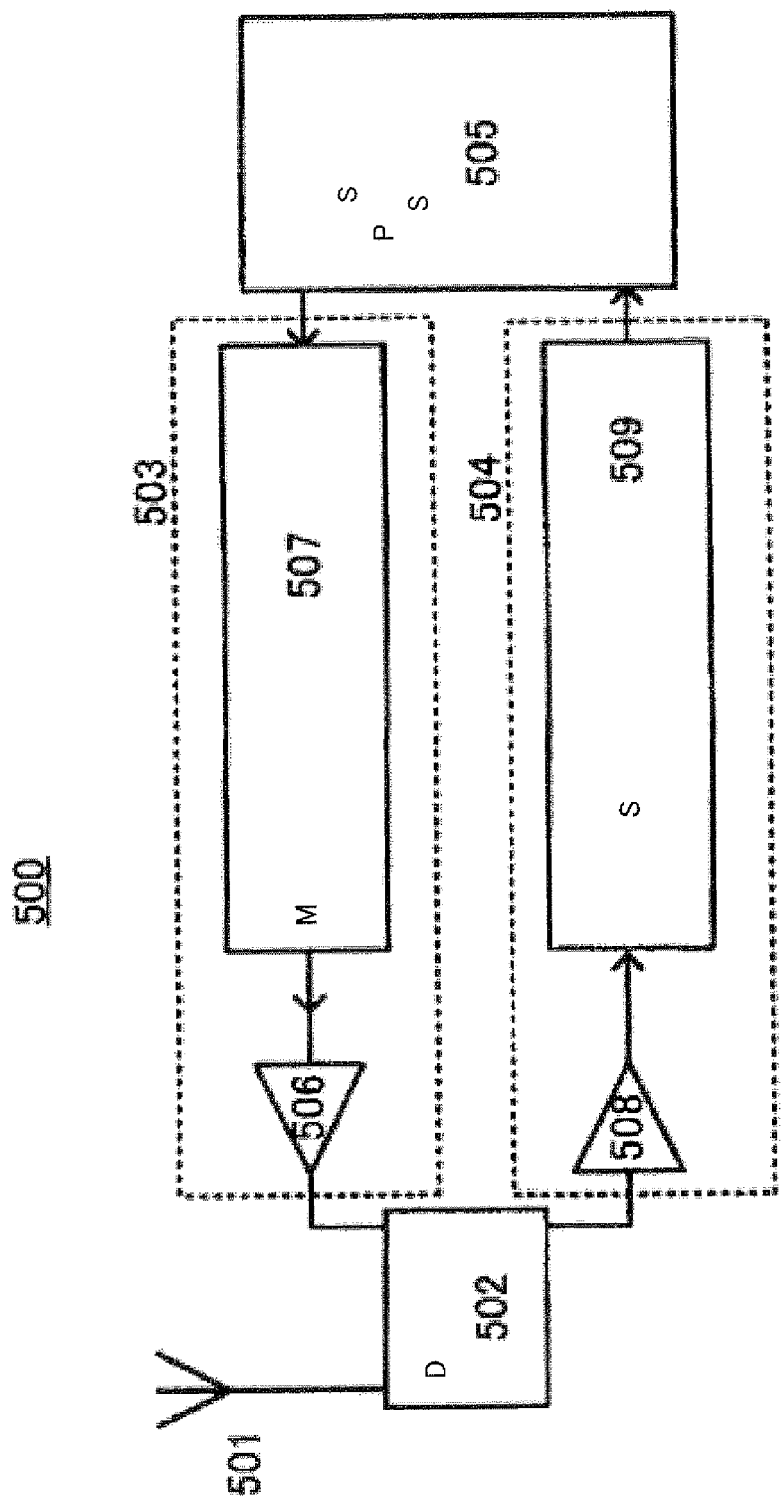
FIG. 25 is a block diagram of a radio apparatus according to Embodiment 6 of the present invention.

FIG. 25 is a block diagram showing an example of the configuration of radio apparatus 500 according to Embodiment 6 of the present invention. Radio apparatus 500 is a mobile phone, car phone, transceiver, or the like, for example.

In FIG. 25, radio apparatus 500 is provided with antenna 501, duplexer 502, transmitting section 503, receiving section 504, and signal processing section (DSP) 505.

Transmitting section 503 has power amplifier (PA) 506 and modulation section 507. Receiving section 504 has low noise amplifier (LNA) 508 and sampling mixer 509.

Antenna 501 is connected to transmitting section 503 and receiving section 504 via duplexer 502. Duplexer 502 supports transmission signal and received signal frequency bands. When a signal is input from transmitting section 503, duplexer 502 passes and outputs to antenna 501 a transmission signal frequency band within that signal. On the other hand, when a signal from antenna 501 is input to duplexer 502, duplexer 502 passes a received signal frequency band within that signal and outputs this to receiving section 504.

In signal processing section 505, an output signal from receiving section 504 undergoes AD conversion followed by signal processing (for example, speech processing or data processing). Also, in signal processing section 505, after a predetermined input signal (for example, speech or data) has undergone signal processing, it undergoes DA conversion and is output to transmitting section 503. One signal processing section 505 is shown in FIG. 25, but a plurality may also be used.

It will be assumed that sampling mixer 100 of Embodiment 1 shown in FIG. 7 is used as sampling mixer 509. Thus, sampling mixer 100 capable of suppressing degradation of reception sensitivity due to a fold-back component by means of non-decimation operation can be applied, which is useful. A sampling mixer of Embodiment 2, 3, 4, or 5 may also be used as sampling mixer 509.

In this embodiment a case has been described in which a radio apparatus includes a sampling mixer, but a radio apparatus may also include a discrete filter that does not have sampling switch 5.

(Embodiment 7)

Figure 26:
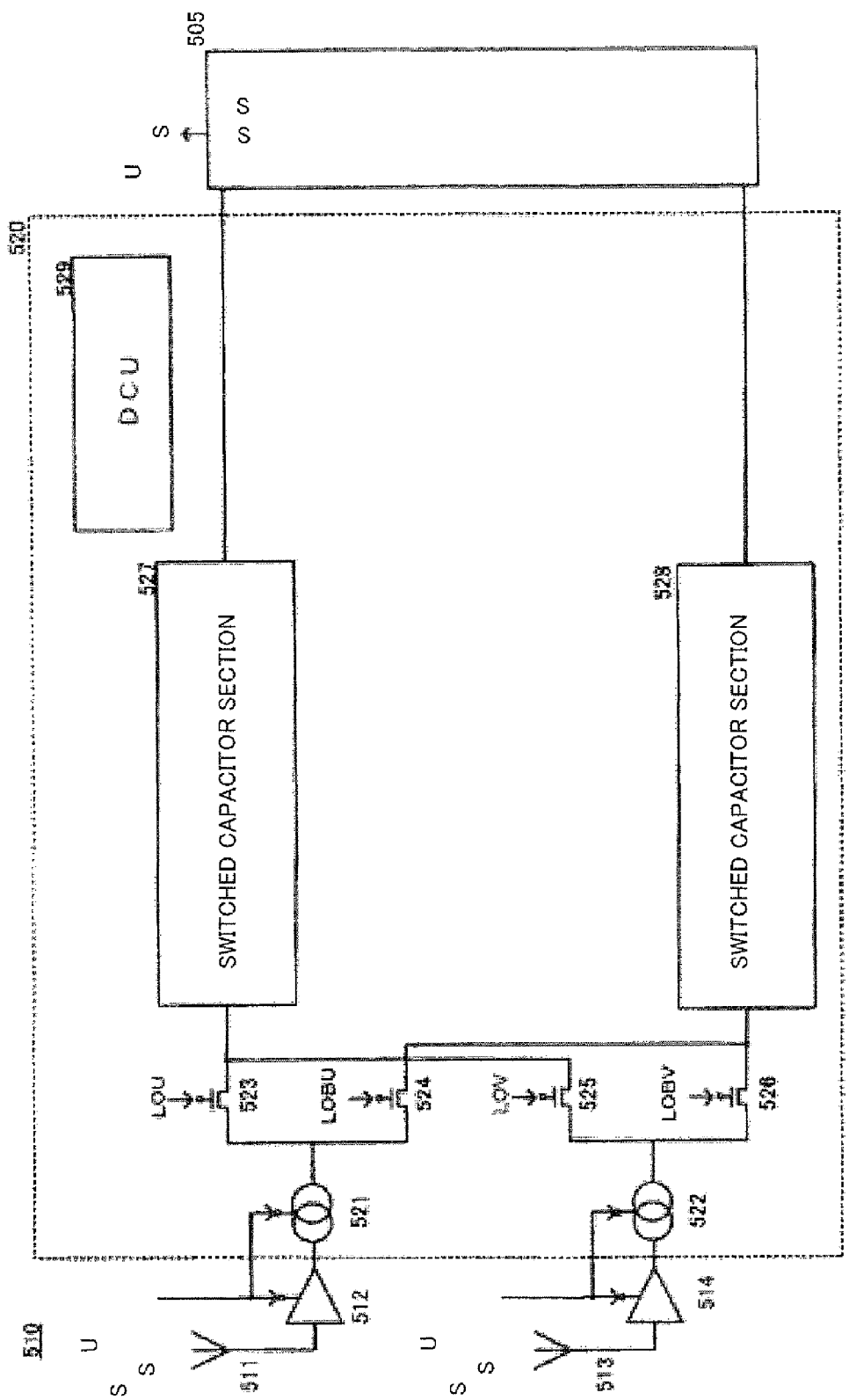
FIG. 26 is a block diagram of a radio apparatus according to Embodiment 7 of the present invention.

FIG. 26 is a block diagram showing an example of the configuration of radio apparatus 510 according to Embodiment 7 of the present invention. In this embodiment, use for UHF band (470 MHz to 770 MHz) and VHF band (90 MHz to 108 MHz, 170 MHz to 222 MHz) terrestrial digital broadcast reception will be described.

In FIG. 26, radio apparatus 510 is provided with antennas 511 and 513, LNAs 512 and 514, sampling mixer 520, and signal processing section 505. Sampling mixer 520 is provided with TAs 521 and 522, sampling switches 523, 524, 525, and 526, switched capacitor sections 527 and 528, and DCU 529. Antenna 511, LNA 512, TA 521, and sampling switches 523 and 524 are used for UHF band reception, and antenna 513, LNA 514, TA 522, and sampling switches 525 and 526 are used for VHF band reception. Operation of LNAs 512 and 514 and TAs 521 and 522 is switched on/off according to a UV switching signal output from signal processing section 505. Sampling switches 523 and 524 perform sampling with an LOU signal and LOBU signal for UHF band reception, and sampling switches 525 and 526 perform sampling with an LOV signal and LOBV signal for VHF band reception. The LOU signal, LOBU signal, LOV signal, and LOBV signal are output from a local oscillation section (not shown). Switched capacitor sections 527 and 528, DCU 529, and signal processing section 505 are common to both UHF band reception and VHF band reception.

The operation of radio apparatus 510 will now be described. In UHF band reception, operation of LNA 512 and TA 521 is turned on and operation of LNA 514 and TA 522 is turned off by the UV switching signal, and the LOV signal and LOBV signal become low signals in order to fix sampling switches 525 and 526 in an off state. Therefore, a UHF band received signal received by antenna 511 is amplified by LNA 512 and input to sampling mixer 520. In sampling mixer 520, the received signal undergoes current conversion by TA 521, is sampled by sampling switches 523 and 524, and is filtered by switched capacitor sections 527 and 528, and the resulting signal is output to signal processing section 505. Similarly, in VHF band reception, operation of LNA 512 and TA 521 is turned off, and sampling switches 523 and 524 are turned off. A VHF band received signal received by antenna 513 is amplified by LNA 514 and input to sampling mixer 520. In sampling mixer 520, the received signal undergoes current conversion by TA 522, is sampled by sampling switches 525 and 526, and is filtered by switched capacitor sections 527 and 528, and the resulting signal is output to signal processing section 505.

It will be assumed that switched capacitor sections 102 and 103 and DCU 104 according to the embodiment shown in FIG. 7 are used as switched capacitor sections 527 and 528 and DCU 529 of sampling mixer 520. Thus, a sampling mixer capable of suppressing degradation of reception sensitivity due to a fold-back component by means of non-decimation operation can be applied, which is useful. The switched capacitor sections and DCU of Embodiment 2, 3, 4, or 5 may also be used as switched capacitor sections 527 and 528 and DCU 529 of sampling mixer 520. By separating LNAs and TAs operating at RF frequency into those for UHF band use and those for VHF band use, circuitry can be optimally designed for the respective frequency bands, and furthermore current consumption can be reduced by turning off the operation of circuitry for a frequency band not being received.

The disclosures of Japanese Patent Application No.2007-176920, filed on Jul. 5, 2007, Japanese Patent Application No.2007-302678, filed on Nov. 22, 2007, and Japanese Patent Application No. 2008-167269, filed on Jun. 26, 2008, including the specifications, drawings and abstracts, are incorporated herein by reference in their entirety.

Industrial Applicability

A discrete time processing filter and sampling mixer of the present invention are suitable for use in radio circuitry of a radio apparatus, and are particularly suitable for performing signal frequency conversion.

The invention claimed is:

1. A discrete filter comprising:
    a control signal generation section that generates N control signals having the same frequency and having phases which are each shifted by a 1/N period (where N is three or four);
    a history capacitor coupled to an input for receiving sampled signals that performs temporally continuous integration of the sampled signals;
    a switched capacitor section coupled to the input that comprises N switched capacitor circuits connected in parallel to each other, each switched capacitor circuit having a rotation capacitor to repeat integrating the sampled signals integrated in the history capacitor and discharging the integrated sampled signals; and
    a buffer capacitor coupled to said switched capacitor section that buffers the integrated sampled signals discharged by the rotation capacitors of the N switched capacitor circuits, wherein:

each switched capacitor circuit has an integration switch to switch a state of input to the rotation capacitor and a discharge switch to switch a state of discharge from the rotation capacitor;

the control signal generation section outputs a control signal of the N control signals to each of the respective integration switches and discharge switches of the N switched capacitor circuits; and each switched capacitor circuit repeats, in the rotation capacitor, at least two operations of an integration operation of the sampled signals integrated in the history capacitor and a discharge operation of the sampled signals to the buffer capacitor in accordance with the control signals, and at each instant of time one of the switched capacitor circuits is performing one of the two operations, the other switched capacitor circuits do not perform the same operation as the one of the two operations.

2. The discrete filter according to claim 1, wherein:

N is four;

the switched capacitor circuits each comprises a feedback switch to switch an input of a feedback signal and a reset switch to reset a charge remaining in the rotation capacitor by grounding;

the control signal generation section outputs a control signal of the N control signals to each of the respective feedback switches and reset switches of the four switched capacitor circuits; and each switched capacitor circuit, in the rotation capacitor, repeats at least four operations of the integration operation, an input operation of the feedback signal, a reset operation of the charge, and the discharge operation in accordance with the control signals, and at each instant of time one of the switched capacitor circuits is performing one of the four operations, the other switched capacitor circuits do not perform the same operation as the one of the four operations.

3. The discrete filter according to claim 2, wherein the feedback switch receives as input a voltage as the feedback signal.

4. The discrete filter according to claim 1, wherein the control signal generation section switches frequencies of the N control signals.

5. A sampling mixer comprising:

the discrete filter according to claim 1; and a sampling switch that is provided before the discrete filter and samples a received signal at a predetermined frequency.

6. A radio apparatus comprising:

the discrete filter according to claim 1; and a signal processing section that performs signal processing based on an output signal of the discrete filter.

7. A radio apparatus comprising:

the sampling mixer according to claim 5; and a signal processing section that performs signal processing based on an output signal of the sampling mixer.

8. The discrete filter according to claim 1, further comprising a non-overlap circuit that provides a non-overlap interval between the N control signals.

9. The discrete filter according to claim 8, wherein the non-overlap circuit has an AND gate to which a signal resulting from a first control signal output from the control signal generation section passing through an odd number of NOT gates and a second control signal output from the control signal generation section are input, and makes output of the AND gate a signal that is input to the switched capacitor section.

10. A sampling mixer comprising:

the discrete filter according to claim 8; and a sampling switch that is provided before the discrete filter and samples a received signal at a predetermined frequency, wherein the non-overlap circuit makes the non-overlap interval a period of the sampling switch$\times(1-N/M)$ (where M and N are different natural numbers).

11. A radio apparatus comprising:

the sampling mixer according to claim 10; and a signal processing section that performs signal processing based on an output signal of the sampling mixer.

* * * * *